(12) United States Patent  
Masuda

(10) Patent No.: US 12,163,845 B2  
(45) Date of Patent: Dec. 10, 2024

(54) SEMICONDUCTOR DEVICE AND TEMPERATURE MEASUREMENT METHOD

(71) Applicant: FUJI ELECTRIC CO., LTD., Kawasaki (JP)

(72) Inventor: Shinichi Masuda, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 524 days.

(21) Appl. No.: 17/568,267

(22) Filed: Jan. 4, 2022

(65) Prior Publication Data

US 2022/0244111 A1    Aug. 4, 2022

(30) Foreign Application Priority Data

Feb. 1, 2021 (JP) .................... 2021-014196

(51) Int. Cl.
*G01K 11/125* (2021.01)
*G01K 13/00* (2021.01)
(Continued)

(52) U.S. Cl.
CPC ............ *G01K 11/125* (2013.01); *G01K 13/00* (2013.01); *H01L 23/34* (2013.01); *H01L 24/32* (2013.01);
(Continued)

(58) Field of Classification Search
CPC ......... H01L 23/34; H01L 24/32; H01L 24/49; H01L 24/48; H01L 25/072; H01L 24/45; H01L 2224/45147; H01L 2924/19107; H01L 2224/48139; H01L 2224/293; H01L 2224/49111; H01L 2224/4813;
(Continued)

(56) References Cited

U.S. PATENT DOCUMENTS 4,355,344 A * 10/1982 Felici .................. H01L 27/0248  
361/103  
11,825,591 B2 * 11/2023 Sato ........................ G01K 7/01  
(Continued)

FOREIGN PATENT DOCUMENTS

DE            3007403 C2 *  8/1989  
DE     102004055908 A1 *  7/2005  ......... H01L 23/4334  
(Continued)

OTHER PUBLICATIONS

17568267_2024-07-24_DE_102004061099_A1_H.pdf,Jun. 29, 2006.*  
(Continued)

*Primary Examiner* — Gail Kaplan Verbitsky  
(74) *Attorney, Agent, or Firm* — Rabin & Berdo, P.C.

(57) ABSTRACT

A semiconductor includes a multilayer substrate including an insulating plate and a plurality of circuit boards disposed on a top face of the insulating plate, a semiconductor element disposed on a top face of one of the plurality of circuit boards, and having a main electrode disposed on a top face thereof, and a temperature measurement device for measuring a temperature of the semiconductor element. The temperature measurement device includes a cable unit composed of an insulated optical fiber, and a temperature measurement unit provided on one end of the cable unit, the temperature measurement unit being bonded to the main electrode of the semiconductor element using a bonding material.

18 Claims, 12 Drawing Sheets

(51) Int. Cl.
*H01L 23/00* (2006.01)
*H01L 23/34* (2006.01)
*H01L 25/07* (2006.01)
*H02M 7/00* (2006.01)
*H02M 7/5387* (2007.01)
*G02F 1/01* (2006.01)

(52) U.S. Cl.
CPC ............. *H01L 24/48* (2013.01); *H01L 24/49* (2013.01); *H01L 25/072* (2013.01); *H02M 7/003* (2013.01); *H02M 7/53871* (2013.01); *G02F 1/0147* (2013.01); *H01L 24/29* (2013.01); *H01L 24/45* (2013.01); *H01L 2224/293* (2013.01); *H01L 2224/29393* (2013.01); *H01L 2224/32145* (2013.01); *H01L 2224/45124* (2013.01); *H01L 2224/45144* (2013.01); *H01L 2224/45147* (2013.01); *H01L 2224/48091* (2013.01); *H01L 2224/48111* (2013.01); *H01L 2224/4813* (2013.01); *H01L 2224/48137* (2013.01); *H01L 2224/48225* (2013.01); *H01L 2224/49176* (2013.01); *H01L 2924/10253* (2013.01); *H01L 2924/10272* (2013.01); *H01L 2924/10329* (2013.01)

(58) Field of Classification Search
CPC ... H01L 2224/48137; H01L 2224/0603; H01L 23/3735; H01L 2224/48091; H01L 2224/49113; H01L 2224/29393; H01L 2224/49176; H01L 2224/48111; H01L 2224/48225; H01L 23/5385; H01L 2224/45124; H01L 2224/32145; H01L 2224/48227; H01L 2224/45015; H01L 2924/10329; H01L 23/5386; H01L 2224/45144; H01L 2924/10272; H01L 24/29; H01L 2924/10253; H01L 2224/4846; H01L 2924/181; H01L 2924/00012; H01L 2924/20752; H01L 2924/20753; H01L 2924/20754; H01L 2924/20755; H01L 2924/20756; H01L 2924/20757; H01L 2924/20758; H01L 2924/20759; H01L 2924/2076; H01L 2924/00014; H01L 2224/451457; H02M 7/003; H02M 7/53871; G01K 13/00; G01K 11/125; G02F 1/0147; G02B 6/4415; G02B 6/4429

See application file for complete search history.

(56) References Cited

U.S. PATENT DOCUMENTS

| | | | |
|---|---|---|---|
| 2015/0014705 A1 | | 1/2015 | Kaguchi et al. |
| 2015/0342463 A1 | | 12/2015 | Garibotto et al. |
| 2016/0377486 A1 | | 12/2016 | Yamashita et al. |
| 2018/0007759 A1 | * | 1/2018 | Yan ................. H01L 25/0753 |
| 2019/0356128 A1 | | 11/2019 | Shimizu |
| 2019/0362992 A1 | | 11/2019 | Monodane et al. |

FOREIGN PATENT DOCUMENTS

| | | | | |
|---|---|---|---|---|
| DE | 102004061099 A1 | * | 6/2006 | ......... H01L 23/3735 |
| DE | 202009017816 U1 | * | 7/2010 | ............ H01L 23/34 |
| DE | 102016102493 B3 | * | 7/2017 | ............ H01L 23/34 |
| EP | 0908713 A1 | * | 4/1999 | |
| JP | H07-14948 A | | 1/1995 | |
| JP | 2001501043 A | * | 1/2001 | |
| JP | 2004063711 A | * | 2/2004 | |
| JP | 2004184869 A | * | 7/2004 | |
| JP | 3560571 B2 | * | 9/2004 | ........... G02B 6/4212 |
| JP | 4438038 B2 | * | 3/2010 | |
| JP | 2010258233 A | * | 11/2010 | |
| JP | 2011-223678 A | | 11/2011 | |
| JP | 2014003095 A | * | 1/2014 | ............ H01L 24/33 |
| JP | 2015-018861 A | | 1/2015 | |
| JP | 2016-509212 A | | 3/2016 | |
| JP | 2017-009449 A | | 1/2017 | |
| JP | 2019-201523 A | | 11/2019 | |
| WO | WO-2016038956 A1 | * | 3/2016 | ......... H01L 21/4878 |
| WO | WO-2017183471 A1 | * | 10/2017 | ............ G10K 11/32 |
| WO | 2018/142958 A1 | | 8/2018 | |

OTHER PUBLICATIONS

17568267_2024-07-24_DE_102016102493_B3_H.pdf,Jul. 20, 2017.*
17568267_2024-07-24_DE_3007403_C2_H.pdf,Aug. 17, 1989.*
17568267_2024-07-24_JP_2001501043_A_H.pdf,Jan. 23, 2001.*
17568267_2024-07-24_JP_2010258233_A_H.pdf,Nov. 11, 2010.*
17568267_2024-07-24_JP_2014003095_A_H.pdf,Sep. 1, 2014.*
17568267_2024-07-26_DE_102004055908_A1_H.pdf,Jul. 28, 2005.*
17568267_2024-07-26_DE_202009017816_U1_H.pdf,Jul. 1, 2010.*
17568267_2024-07-26_WO_2016038956_A1_H.pdf,Mar. 17, 2016.*
17568267_2024-07-26_EP_0908713_A1_H.pdf,Apr. 14, 1999.*
17568267_2024-07-26_WO_2017183471_A1_H.pdf,Oct. 26, 2017.*
17568267_2024-07-30_JP_2004063711_A_H.pdf,Feb. 26, 2004.*
17568267_2024-07-30_JP_2004184869_A_H.pdf,Jul. 2, 2004.*
17568267_2024-07-30_JP_3560571_B2_H.pdf,Sep. 2, 2004.*
17568267_2024-07-30_JP_4438038_B2_H.pdf,Mar. 24, 2010.*
"GaAs technology overview", Opsens Inc., IMP0119, Rev 1.0.
"Opsens White-Light Polarization Interferometry Technology", Opsens Inc., IMP0002, WLPI, Rev3_0.

* cited by examiner

SEMICONDUCTOR DEVICE AND TEMPERATURE MEASUREMENT METHOD

CROSS REFERENCE TO RELATED APPLICATIONS

This application is based upon and claims the benefit of priority of the prior Japanese Patent Application No. 2021-014196, filed on Feb. 1, 2021, the entire contents of which are incorporated herein by reference.

BACKGROUND OF THE INVENTION

Field of the Invention

The present invention relates to a semiconductor device and a temperature measurement method.

Description of the Related Art

Semiconductor devices have a substrate on which semiconductor elements such as an insulated-gate bipolar transistor (IGBT), a power metal-oxide-semiconductor field-effect transistor (power MOSFET), and a free-wheeling diode (FWD) are provided, and are used in apparatus such as inverters.

Inverter apparatuses used widely for applications such as driving consumer and industrial motors include semiconductor switching elements (switching elements) such as MOSFETs and IGBTs, and a driving integrated circuit (IC chip) that drives the semiconductor switching elements. Also, an intelligent power module (IPM) combining the above switching elements and the IC chip into a single package is used as a means of miniaturizing equipment and incorporating the module into a protective circuit.

In semiconductor devices, the driving of the semiconductor elements generates heat, thereby necessitating a design that takes the heat into account. For example, Japanese Patent Laid-Open Nos. 2015-018861, 2019-201523, and 2017-009449 disclose various methods of measuring the temperature of semiconductor elements. Japanese Patent Laid-Open No. 2015-018861 describes using an optical fiber and a photodiode to detect the emission intensity of a semiconductor element that emits light when in operation, and calculating the temperature of the semiconductor element from the detected value. Japanese Patent Laid-Open No. 2019-201523 describes disposing an element for temperature detection separately from a power semiconductor element. Japanese Patent Laid-Open No. 2017-009449 describes detecting the temperature of a semiconductor with a thermocouple.

SUMMARY OF THE INVENTION

Meanwhile, in recent development of semiconductor devices, there is demand for a thermal design in which a temperature distribution of the individual semiconductor elements is measured, and the semiconductor device is operated within a stable operating range in which the semiconductor elements have a predetermined temperature. However, measuring the temperature of the semiconductor elements directly is difficult.

An objective of the present invention, which has been made in light of such points, is to provide a semiconductor device and a temperature measurement method capable of measuring the temperature of each semiconductor element safely and accurately.

A semiconductor device according to one aspect of the present invention comprises a multilayer substrate in which a plurality of circuit boards are formed on a top face of an insulating plate, a semiconductor element disposed on a top face of a predetermined circuit board among the plurality of circuit boards, the semiconductor element having a top face on which a main electrode is formed, and a temperature measurement device that measures a temperature of the semiconductor element, wherein the temperature measurement device includes a cable unit composed of an optical fiber with insulating properties and a temperature measurement unit provided on a leading end of the cable unit, and the temperature measurement unit is bonded to the main electrode using a bonding material.

A temperature measurement method according to another aspect of the present invention is a temperature measurement method for using a temperature measurement device to measure a temperature of a semiconductor element having a top face on which a main electrode is formed, the temperature measurement device including a cable unit composed of an optical fiber with insulating properties and a temperature measurement unit provided on a leading end of the cable unit, the temperature measurement method comprising measuring the temperature of the main electrode of the semiconductor element on a basis of a change in an output of the temperature measurement unit, wherein a leading end of the temperature measurement unit is bonded to the main electrode using a bonding material.

According to the present invention, the temperature of each semiconductor element can be measured safely and accurately.

DETAILED DESCRIPTION OF THE PREFERRED EMBODIMENTS

Figure 1:
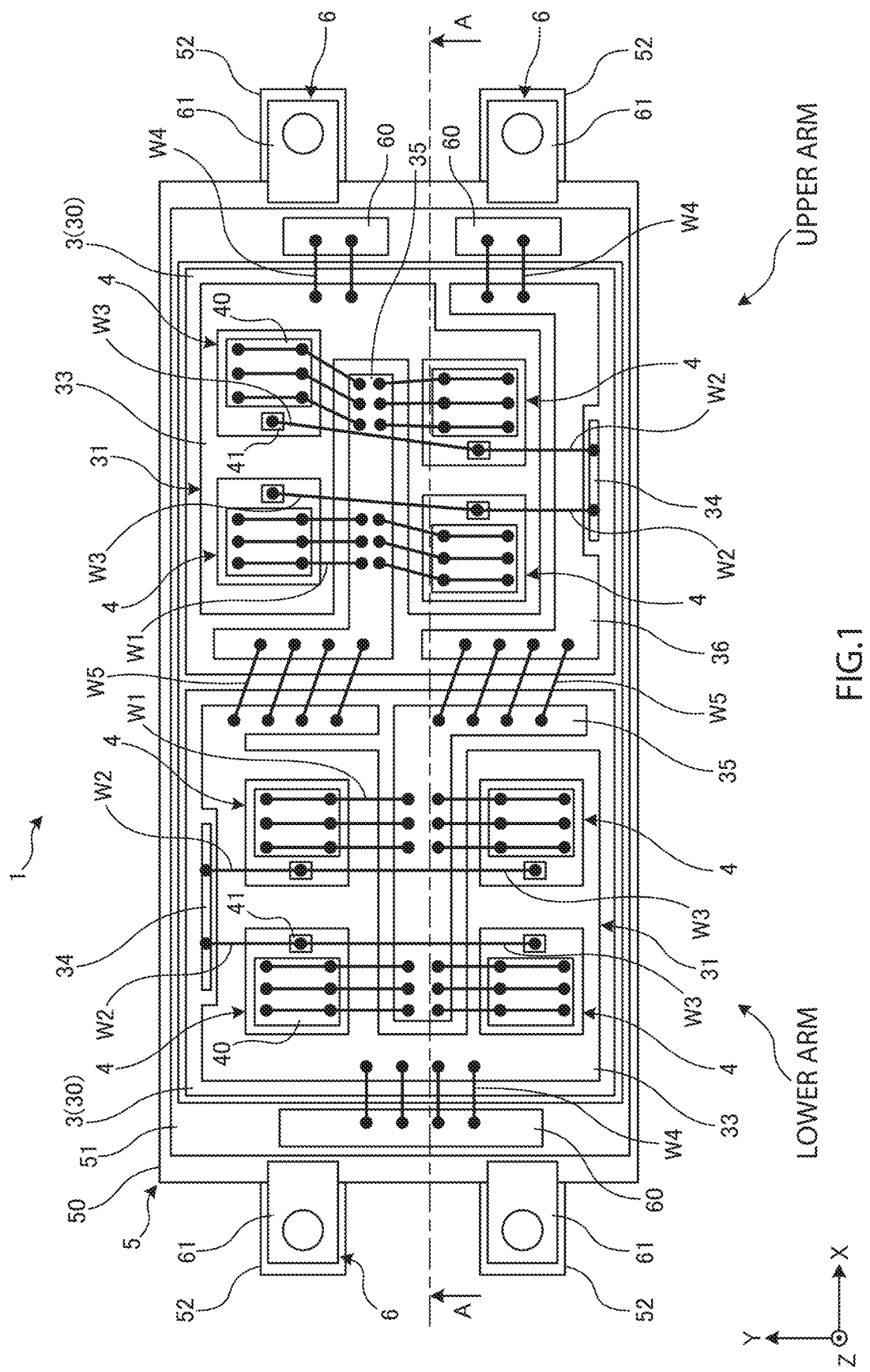
FIG. 1 is a schematic plan view illustrating an example of a semiconductor device according to an embodiment.
Figure 2:
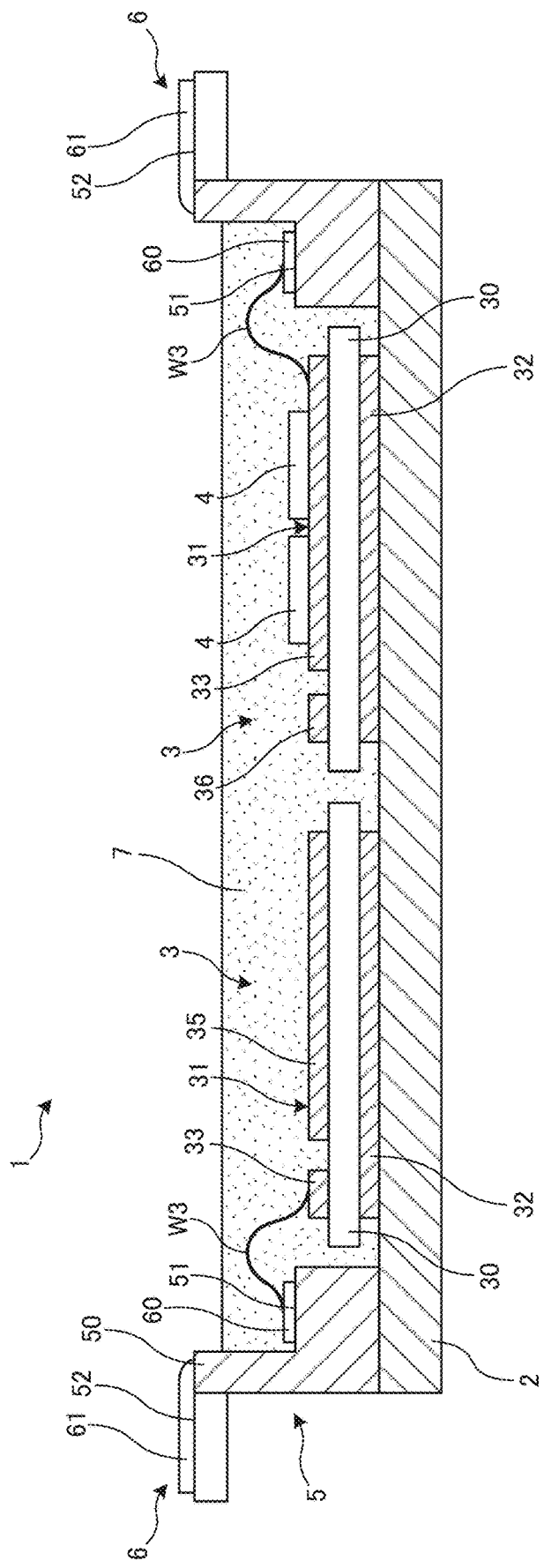
FIG. 2 is a schematic cross-section view illustrating an example of the semiconductor device according to the present embodiment.
Figure 3:
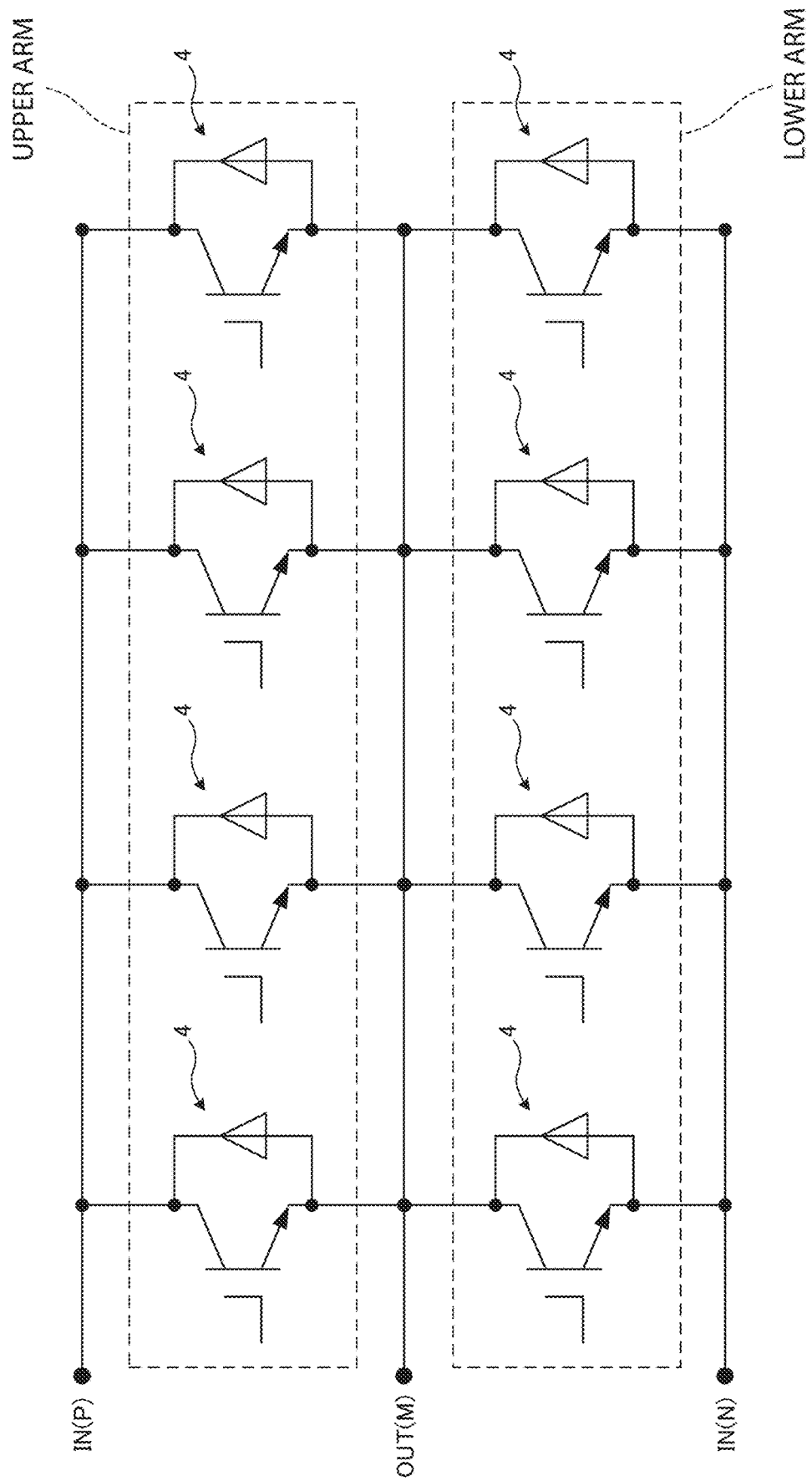
FIG. 3 is a schematic diagram illustrating an electric circuit according to the present embodiment.

Hereinafter, a semiconductor device to which the present invention can be applied will be described. FIG. 1 is a schematic plan view illustrating an example of a semiconductor device according to the present embodiment. FIG. 2 is a schematic cross-section view illustrating an example of the semiconductor device according to the present embodiment. Specifically, FIG. 2 is a cross section taken along A-A in FIG. 1. FIG. 3 is a schematic diagram illustrating an electric circuit according to the present embodiment. Note that the semiconductor device illustrated below is merely one non-limiting example, and may be modified appropriately.

Also, in the following diagrams, the longitudinal direction of the semiconductor device (the direction in which a plurality of multilayer substrates are arranged, or the direction in which the upper and lower arms are arranged) is designated the X direction, the lateral direction of the semiconductor device is designated the Y direction, and the height direction (the substrate thickness direction) is designated the Z direction. The illustrated X, Y, and Z axes are orthogonal to each other and constitute a right-handed coordinate system. Additionally, in some cases, the X direction may be referred to as the left-right direction, the Y direction as the front-back direction, and the Z direction as the up-down direction. These directions (front-back, left-right, and up-down directions) are terms used for convenience in the description, and depending on the installed attitude of the semiconductor device, the correspondence relationships between these directions and the XYZ directions may change. For example, the surface on the heat-dissipating side (cooler side) of the semiconductor device is referred to as the bottom face, while the opposite side is referred to as the top face. Also, in this specification, a plan view means the case of viewing the top face of the semiconductor module from the positive Z direction. Also, in this specification, the directional and angular notation is a general indication of the direction or angle, and variations within ±10 degrees are considered tolerable.

A semiconductor device 1 is applied to a power conversion device such as a power module, for example, and forms an inverter circuit (see FIG. 3). As illustrated in FIGS. 1 and 2, the semiconductor device 1 includes components such as a base plate 2, a multilayer substrate 3, and a plurality of semiconductor elements 4. Although described in detail later, the semiconductor device 1 also includes a case member 5 that houses the multilayer substrate 3 and the plurality of semiconductor elements 4, and an encapsulating resin 7 that fills the case member 5.

The base plate 2 is a rectangular plate having a top face and a bottom face. The base plate 2 functions as a heatsink, and is formed having a rectangular shape in a plan view that is long in the X direction by a metal plate with favorable thermal conductivity, such as copper or aluminum. The surface of the base plate 2 may also be subjected to a plating treatment, for example.

The multilayer substrate 3 is disposed on the top face (main surface) of the base plate 2. The multilayer substrate 3 is formed by stacking conducting layers and insulating layers, and are formed having a square shape in a plan view. In the present embodiment, two multilayer substrates 3 are arranged side by side in the longitudinal direction (X direction) of the base plate 2. The two multilayer substrates 3 are disposed on the top face of the base plate 2 through a material such as solder (not illustrated), for example. Although described in detail later, of the two multilayer substrates 3, the one on the positive X side acts as an upper arm, and the one on the negative X side acts as a lower arm.

Each multilayer substrate 3 is a direct copper bonding (DCB) substrate or an active metal brazing (AMB) substrate, for example. Specifically, each multilayer substrate 3 includes an insulating plate 30 having a top face and a bottom face as main surfaces, a circuit board 31 formed on the top face of the insulating plate 30, and a metal plate 32 formed on the bottom face of the insulating plate 30. The insulating plate 30 is formed having a square shape in a plan view by an insulating material such as ceramic or resin. The insulating plate 30 may also be referred to as an insulating layer or an insulating film. For the insulating material, a ceramic material such as alumina ($Al_2O_3$), aluminum nitride (AlN), or silicon nitride ($Si_3N_4$), a resin material such as epoxy, or a resin material using a ceramic material as a filler is used, for example.

The circuit board 31 contains a metal layer of predetermined thickness formed by copper foil or the like. The circuit board 31 may also be referred to as a conducting layer or a circuit pattern. The circuit board 31 includes a plurality of circuit boards 33 to 36 in independent islands (that is, electrically isolated from each other) in a plan view. In FIG. 1, three independent circuit boards 33 to 35 are formed on the insulating plate 30 positioned on the left side of the page. On the left side of the page, the circuit board 33 is a main current wiring layer on the high potential side of the lower arm, the circuit board 35 is a main current wiring layer on the low potential side of the lower arm, and the circuit board 34 is a control wiring layer of the lower arm.

On the other hand, four independent circuit boards 33 to 36 are formed on the insulating plate 30 positioned on the right side of the page. On the right side of the page, the circuit board 33 is a main current wiring layer on the high potential side of the upper arm, the circuit board 35 is a main current wiring layer on the low potential side of the upper arm, the circuit board 36 is a main current wiring layer on the low potential side of the lower arm, and the circuit board 34 is a control wiring layer of the upper arm. Note that the corresponding circuit boards 31 on each of the left and right insulating plates 30 are denoted with the same sign for convenience. Also, each circuit board 31 will be described later.

The metal plate 32 contains a metal layer of predetermined thickness formed by copper foil or the like, similarly to the circuit board 31. The metal plate 32 may also be referred to as a heatsink. The metal plate 32 has a flat surface and has a square shape in a plan view that covers substantially all of the bottom face of the insulating plate 30. Specifically, the outer periphery of the metal plate 32 is positioned slightly inward from the outer periphery of the insulating plate 30. The bottom face of the metal plate 32 faces the top face of the base plate 2. The metal plate 32 is bonded to the top face of the base plate 2 through a material such as solder not illustrated.

Four semiconductor elements 4 are disposed on the top face of the circuit board 33. The semiconductor elements 4 are formed having a square shape in a plan view by a semiconductor substrate such as silicon (Si) or silicon carbide (SiC) for example. In the present embodiment, the semiconductor elements 4 are configured as a reverse-conducting insulated-gate bipolar transistor (RC-IGBT) element combining the functions of an IGBT element and a free-wheeling diode (FWD) element.

Note that the semiconductor elements 4 are not limited to the above, and a switching element such as an IGBT or a power metal-oxide-semiconductor field-effect transistor (power MOSFET), or a diode such as a free-wheeling diode (FWD) may also be used singly. Also, an element such as a reverse-blocking IGBT (RB-IGBT) having a sufficient withstand voltage with respect to reverse bias may also be used. Also, properties such as the shape, number, and placement of the semiconductor elements 4 may be changed appropriately.

The top face of each semiconductor element 4 is provided with a front electrode as a main electrode 40, an emitter electrode for the IGBT element for example, and an anode for the FWD element. The top face of each semiconductor element 4 is also provided with a gate electrode for the IGBT element for example as a control electrode 41. Also, the bottom face of each semiconductor element 4 is provided with a back electrode not illustrated as a main electrode, a collector electrode for the IGBT element for example, and a cathode for the FWD element. The bottom face of each semiconductor element 4 is electrically bonded to the top face of the circuit board 33 through solder or a metal sintered material (not illustrated), for example.

Also, a frame-shaped case member 5 is disposed on the top face on the outer circumference of the base plate 2. The case member 5 is formed by plastic for example, and is bonded to the base plate 2 through an adhesive (not illustrated). The case member 5 has an annular wall part 50 that surrounds the perimeter of the two multilayer substrates 3. The annular wall part 50 is formed having a squared ring shape in a plan view that follows the outer shape of the base plate 2. Also, the annular wall part 50 stands upright in the thickness direction of the semiconductor device 1 (vertical direction). A step part 51 that is a step down is formed on the inner circumferential side of the top face of the annular wall part 50. The step part 51 is formed by a recess having a squared ring shape, and the top face of the step part 51 is provided at a lower position than the top face of the annular wall part 50.

Also, terminal members 6 are respectively embedded in the pair of walls facing each other in the longitudinal direction of the annular wall part 50. Tabular projecting tabs 52 that project horizontally outward are formed on the upper edges of the annular wall part 50 in correspondence with the terminal members 6.

The terminal members 6 are formed by bending a plate-like body of metal, for example. The terminal members 6 have an inner terminal part 60 exposed on the top face of the step part 51 and an outer terminal part 61 exposed on the top face of the projecting tabs 52. The terminal members 6 (M terminals) positioned on the left side of the page in FIG. 1 are formed integrally such that one inner terminal part 60 and two outer terminal parts 61 are electrically connected inside the annular wall part 50. On the other hand, the terminal members 6 positioned on the right side of the page in FIG. 1 are each formed integrally such that one inner terminal part 60 and one outer terminal part 61 are electrically connected inside the annular wall part 50. In other words, on the right side of the page in FIG. 1, two electrically independent terminal members 6 (a P terminal on the upper side and an N terminal on the lower side) are arranged side by side in the lateral direction of the annular wall part 50 (the up-down direction on the page).

Wiring members W1 to W5 are connected to each of the semiconductor elements 4, the circuit boards 31, and the terminal members 6. Conductor wires (bonding wires) are used as the wiring members W1 to W5. Gold, copper, aluminum, gold alloy, copper alloy, and aluminum alloy can be used either singly or in combination with each other as the material of the conductor wires. The outer diameter of the conductor wires is 25 μm or greater and 500 μm or less. A plurality of conductor wires may also be connected in parallel. Additionally, it is also possible to use members other than conductor wires as the wiring members. For example, ribbons or a lead frame can be used as the wiring members.

In FIG. 1, the circuit board 35 and the semiconductor elements 4 are electrically connected by the wiring member W1. One end of the wiring member W1 is bonded to the main electrode 40 on the front surface of the semiconductor elements 4, while the other end is bonded to the circuit board 35. The wiring member W1 is preferably bonded to the main electrode 40 in two locations, one near an edge of the main electrode and the other near an opposite edge. In so doing, current can be supplied to the main electrode 40 in a distributed manner. Also, in the central wire portion between the edge and the opposite edge, the wiring member W1 can be disposed a predetermined distance away from the main electrode 40. Consequently, a temperature measurement unit 81 of a temperature measurement device 8 described later (see FIGS. 4 and 5) can be disposed in the center of the main electrode 40. Additionally, the wiring member W1 may be multiple wires depending on the volume of main current. In this case, the wiring member W1 is preferably a plurality of wires arranged in parallel in the portion that overlaps with the main electrode 40 in a plan view. This arrangement makes it easier to dispose the temperature measurement unit and a cable unit of the temperature measurement device described later on the main electrode 40.

Also, in FIG. 1, the circuit board 34 and the semiconductor elements 4 disposed on the circuit board 34 side (the two semiconductor elements 4 on the positive Y side on the left side of page in FIG. 1, and the two semiconductor elements 4 on the negative Y side on the right side of the page in FIG. 1) are electrically connected by the wiring member W2. More specifically, one end of the wiring member W2 is bonded to the control electrode 41 on the front surface of the semiconductor elements 4, while the other end is bonded to the circuit board 34.

Also, in FIG. 1, the pairs of semiconductor elements 4 facing each other across the circuit board 35 are electrically connected by the wiring member W3. Specifically, one end of the wiring member W3 is bonded to the control electrode 41 on the front surface of the semiconductor elements 4, while the other end is bonded to the control electrode 41 on the front surface of the semiconductor elements 4 facing each other across the circuit board 35. The wiring member W2 and the wiring member W3 may also be connected at the junction with the control electrode 41.

Also, on the left side of the page in FIG. 1, the circuit board 33 on which the semiconductor elements 4 are mounted and the inner terminal part 60 are electrically connected by the wiring member W4. Similarly, on the right side of the page in FIG. 1, the circuit board 33 on which the semiconductor elements 4 are mounted and one of the inner terminal parts 60 are electrically connected by the wiring member W4. Also, on the right side of the page in FIG. 1, the circuit board 36 and the other of the inner terminal parts 60 are electrically connected by the wiring member W4.

Also, the circuit board 33 on the left side of the page and the circuit board 35 on the right side of the page in FIG. 1 are electrically connected by the wiring member W5. Similarly, the circuit board 35 on the left side of the page and the circuit board 36 on the right side of the page in FIG. 1 are electrically connected by the wiring member W5. Note that the wiring members W1, W4, and W5 may also be referred to as main current wiring members, and the wiring members W2 and W3 may also be referred to as control wiring members.

In this way, in the present embodiment, a portion of an inverter circuit is formed by the above configuration (particularly the multilayer substrates 3, the semiconductor elements 4, and the various wiring members). For example, as illustrated in FIGS. 1 and 3, the four semiconductor elements 4 forming the upper arm (on the right side of the page in FIG. 1) are connected in parallel. Similarly, the four semiconductor elements 4 forming the lower arm (on the left side of the page in FIG. 1) are connected in parallel. Also, the upper arm and the lower arm are connected in series. By arranging three of the single module configured in this way side by side in the U phase, V phase, and W phase as described later, it is possible to configure a three-phase inverter circuit (see FIG. 12).

The internal space of the case member 5 prescribed by the annular wall part 50 is encapsulated by the encapsulating resin 7. Specifically, the interior of the case member 5 is filled with enough encapsulating resin 7 to sufficiently cover the multilayer substrates 3, the semiconductor elements 4, the wiring members, and the inner terminal parts 60. Note that an epoxy resin or a silicone gel may be used as the encapsulating resin 7. Also, the upper space of the case member 5 after being filled with the encapsulating resin 7 may be sealed by a sheet-like lid member 53 (see FIG. 7).

Meanwhile, in semiconductor devices, the driving of the semiconductor elements generates heat, thereby necessitating a design that takes the heat into account. In recent development of semiconductor devices, there is demand for thermal design in which a temperature distribution of the individual semiconductor elements is measured, and the semiconductor device is operated within a stable operating range in which the semiconductor elements have a predetermined temperature.

In the related art, a semiconductor device is thermally evaluated according to the following methods, for example.
(1) The thermal energy loss is measured from operating conditions of the semiconductor device, and the loss and the thermal resistance (thermal load) of the semiconductor device are used to estimate the semiconductor element temperature.
(2) A special-purpose sample (also referred to as an open sample) used for thermal measurement and provided with a thermistor is prepared, and the semiconductor element temperature is estimated from the temperature of the thermistor.
(3) A sample with an attached thermocouple is used to measure the semiconductor element temperature from the thermocouple while the semiconductor device is actually operating.
(4) A tiny current is applied before and after the actual operation of the semiconductor device, and the semiconductor element temperature is estimated from corresponding changes in the voltage.

However, with the above methods, problems like the following occur.
(1) Because the loss of thermal energy is measured by an average value for the entire device, the temperature of each semiconductor element cannot be estimated.
(2) Because the sample for thermal measurement is different from the actual device, there is a possibility that the differences may also be reflected in the semiconductor element temperature. Moreover, because the thermistor and the semiconductor elements are at a distance, the direct semiconductor element temperature cannot be estimated. Consequently, it is difficult to correctly recognize changes in the semiconductor element temperature in a short time, for example.
(3) Because the thermocouple is attached directly to the semiconductor element to be measured, the potential of the semiconductor element and the potential of the thermocouple are equal. Because the semiconductor element has an extremely high voltage during device operation, adequate security measures are necessary to prevent the potential near the semiconductor elements from turning back around to the thermocouple.
(4) A separate configuration for applying the tiny current is necessary. Also, because the voltage change is an average value for the entire device, the temperature of each semiconductor element cannot be estimated.

Figure 4:
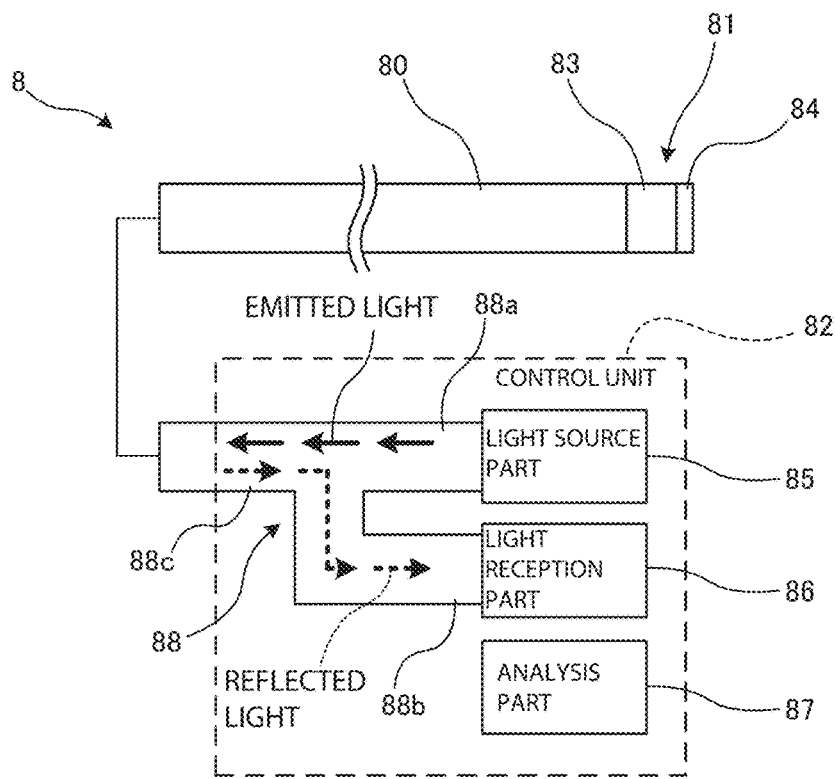
FIG. 4 is a schematic diagram illustrating an example of a temperature measurement device according to the present embodiment.
Figure 5:
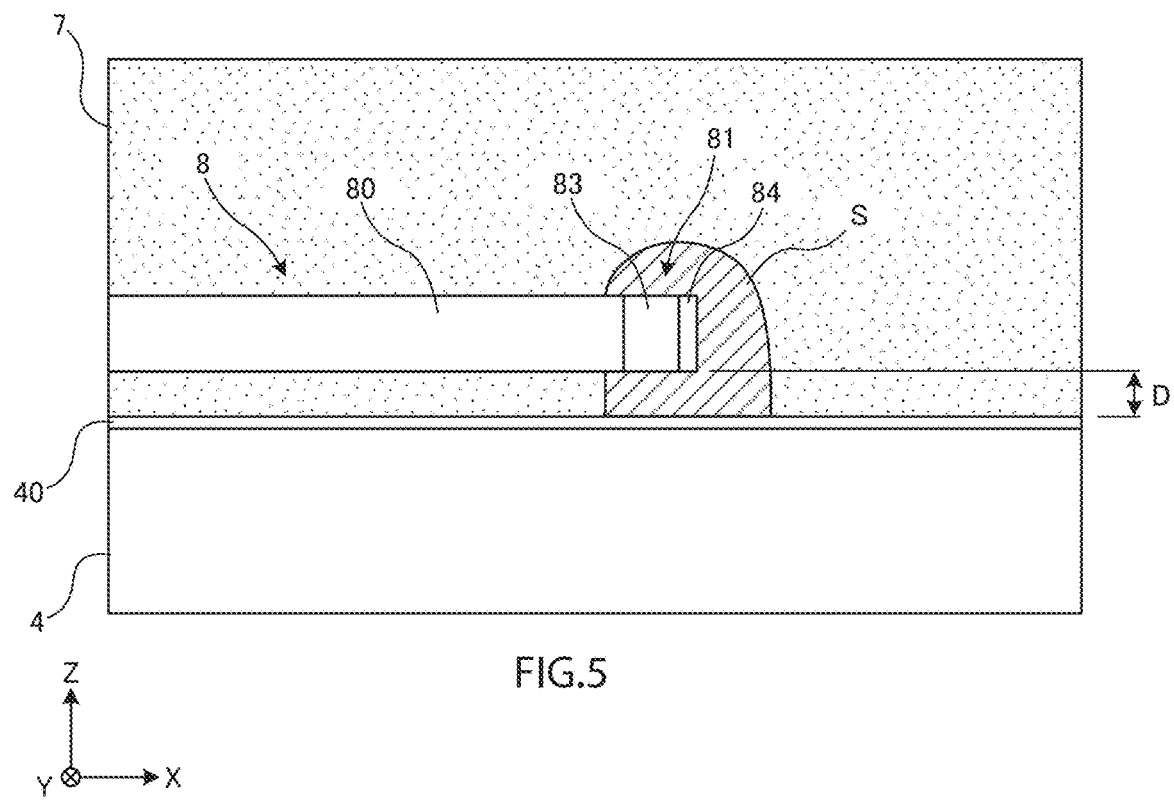
FIG. 5 is a schematic diagram illustrating a practical example of a temperature measurement device according to the present embodiment.

Accordingly, the inventor conceived of the present invention in order to measure the temperature of each semiconductor element safely and precisely. The present embodiment is configured to measure the surface temperature of a semiconductor element 4 by using a temperature measurement device 8 configured using an optical fiber. Here, FIGS. 1 to 5 will be referenced to describe a temperature measurement device and a temperature measurement method according to the present embodiment in detail. FIG. 4 is a schematic diagram illustrating an example of the temperature measurement device according to the present embodiment. FIG. 5 is a schematic diagram illustrating a practical example of the temperature measurement device according to the present embodiment. Note that the temperature measurement device illustrated below is merely one non-limiting example, and may be modified appropriately.

As illustrated in FIGS. 4 and 5, the temperature measurement device 8 according to the present embodiment is composed of an optical sensor. Specifically, in the temperature measurement device 8, an optical heat-sensitive element is attached to the leading end of an optical fiber, and the semiconductor element temperature is measured on the basis of the state of light (for example, the intensity or spectrum) that changes according to the heat-sensitive element. For example, the temperature measurement device 8 includes a cable unit 80, a temperature measurement unit 81, and a control unit 82.

The cable unit 80 is an optical fiber cable composed of an optical fiber with insulating properties. Light is passable through the interior of the cable unit 80. The control unit 82 is connected to the base end of the cable unit 80, and the temperature measurement unit 81 is connected to the leading end of the cable unit 80.

The cable unit 80 is formed using an insulating material. Specifically, the cable unit 80 has a two-layer structure including a central core and a cladding that covers the outer circumference of the core. The core and the cladding may be an optical glass such as quartz glass or fluoride glass that transmits light, or an optical plastic such as fluoride polymer, polymethylmethacrylate, polycarbonate, or polystyrene. Furthermore, the cable unit 80 may also have a three-layer structure including a protective film that covers the core and the cladding. The protective film may be an insulating resin such as silicone resin or nylon.

Also, the cable unit 80 is formed in a linear shape having a circular cross section. The outer diameter of the cable unit 80 is 50 µm or greater and 400 µm or less. The outer diameter of the cable unit 80 is preferably narrower than the outer diameter of the wiring member W1 bonded to the main electrode 40 on the front surface of the semiconductor element 4. With this arrangement, it is possible to prevent severing of the wiring member W1 bonded to the same main electrode 40 as the temperature measurement unit 81, even if the cable unit 80 deforms due to heat from the semiconductor element 4. Note that the length of the cable unit 80 can be set freely between the temperature measurement unit 81 and the control unit 82.

The temperature measurement unit 81 is provided on the leading end of the cable unit 80, and is disposed on the surface of the temperature measurement location. The temperature measurement unit 81 has a cuboid outer shape, with each of the length, width, and thickness being from 50 μm or greater and 200 μm or less. In other words, the temperature measurement unit 81 is formed to have a rectangular cross section cut in a direction orthogonal to the axial direction. Also, the cross section of the temperature measurement unit 81 is preferably smaller than the outer shape of the wiring member W1 bonded to the main electrode 40 on the front surface of the semiconductor element 4. With the arrangement, the temperature measurement unit 81 can be disposed without interfering with the plurality of wiring members W1 bonded to the same main electrode as the temperature measurement unit 81.

Specifically, the temperature measurement unit 81 includes a heat-sensitive part 83 and a mirror part 84. The heat-sensitive part 83 is an optical heat-sensitive element disposed on the leading end of the cable unit. Such a heat-sensitive element may be a polarizing interference material that changes the optical path length of transmitted light depending on the temperature. Alternatively, such a heat-sensitive element may be a band-gap semiconductor that changes the wavelength of transmitted light depending on the temperature. The heat-sensitive part 83 is formed by a gallium arsenide (GaAs) single crystal, for example. The heat-sensitive part 83 is not limited to the above, and may also be composed of an optical element formed using another material.

The mirror part 84 is disposed on the leading end of the heat-sensitive part 83. In other words, the heat-sensitive part 83 is sandwiched (interposed) between the leading end of the cable unit 80 and the mirror part 84. Although described in detail later, the mirror part 84 is composed of an optical element (for example, a dielectric mirror or a derivative mirror) that reflects light transmitted from a light source part 85 through the cable unit 80 and the temperature measurement unit 81 (heat-sensitive part 83).

The control unit 82 centrally controls each component of the temperature measurement device 8. Specifically, the control unit 82 includes a light source part 85, a light reception part 86, and an analysis part 87. The control unit 82 emits light (emitted light) from the light source part 85, causes reflected light to be incident on the light reception part 86, and calculates the temperature of the semiconductor element 4 on the basis of the emitted light and the reflected light with the analysis part 87.

The cable unit 80 may also be connected to a splitting part 88 inside the control unit 82. The splitting part 88 is an optical fiber cable composed of an optical fiber with insulating properties, similarly to the cable unit 80. The splitting part 88 splits the optical path into two paths partway through the cable, and is provided with three terminals.

Specifically, the splitting part 88 is provided with a first terminal 88a connected to the light source part 85, a second terminal 88b connected to the light reception part 86, and a third terminal 88c connected to the cable unit 80. The first terminal 88a guides emitted light emitted from the light source part 85 to the cable unit 80. The second terminal 88b guides reflected light from the temperature measurement unit 81 to the light reception part 86. The third terminal 88c guides emitted light from the light source part 85 to the cable unit 80 from the first terminal 88a, and also guides reflected light going through the cable unit 80 from the temperature measurement unit 81 to the second terminal 88b and the light reception part 86. In this way, the cable unit 80 and the splitting part 88 form an optical pathway capable of guiding emitted light from the light source part 85 as well as reflected light from the temperature measurement unit 81 (mirror part 84). Note that in FIG. 4, the emitted light is illustrated with solid lines and the reflected light is illustrated with dashed lines for convenience.

The light source part 85 irradiates the base end of the cable unit 80 with controlled emitted light. As described above, the light source part 85 is provided at the first terminal 88a of the splitting part 88, and light is radiated (emitted) from the base end of the cable unit 80 toward the temperature measurement unit 81 on the leading end. The light source part 85 may be a white light source.

The light reception part 86 receives reflected light from the heat-sensitive part 83. As described above, the light reception part 86 is provided at the second terminal 88b of the splitting part 88, and receives reflected light that is reflected by the heat-sensitive part 83 and transmitted through the cable unit 80. The light reception part 86 may be an image sensor.

The analysis part 87 includes an optical spectral analysis device. The analysis part 87 calculates the temperature of the semiconductor element 4 on the basis of the light (reflected light) emitted from the light source part 85, passed through the cable unit 80 and the heat-sensitive part 83, and reflected by the mirror part 84. More specifically, the analysis part 87 calculates (estimates) the temperature of the temperature measurement location (in the present embodiment, the main electrode 40) by detecting changes in the spectral intensity distribution of the emitted light emitted from the light source part 85 and the reflected light (which may also be referred to as the optical signal) returning from the temperature measurement unit 81.

In the method of measuring the temperature of the semiconductor element 4 using the temperature measurement device 8 configured in this way, the leading end of the temperature measurement unit 81 is bonded to the top face of the main electrode 40 with a bonding material S. An adhesive with high thermal conductivity is used as the bonding material S. Such an adhesive may also be obtained by dispersing a conductive filler, including a metal powder such as copper, nickel, or silver, or a carbon material such as graphite or carbon nanotubes, in a binder resin such as epoxy or urethane. After curing, such an adhesive exhibits high thermal conductivity due to the conductive filler.

On the other hand, a conductive path is formed by the above bonding material S. Consequently, with the thermal evaluation method that involves attaching a thermocouple according to the related art, it is necessary to insulate (cover) the thermocouple with an insulating material of sufficient thickness, which makes it difficult to evaluate small locations and also results in poor measurement accuracy due to the reduced thermal conductivity. Note that the bonding material S is not limited to an adhesive containing metal or carbon, and may also be solder or a metal sintered material.

For example, when the temperature of the semiconductor element 4 rises due to the operation of the semiconductor device 1, the temperature measurement device 8 measures the temperature of the semiconductor element 4 (temperature of the main electrode 40) on the basis of changes in the light transmitted through the temperature measurement unit 81 in association with changes in the semiconductor element temperature. In other words, the temperature measurement device 8 detects a change in properties due to the temperature of the measuring element, namely the temperature measurement unit 81, as a change in the optical properties. Note that the thickness of the heat-sensitive part 83 in the axial direction is preferably approximately 100 μm, for example.

According to this configuration, because the cable unit 80 that constitutes the majority of the temperature measurement device 8 contains an optical fiber with insulating properties, it is possible to measure the surface of the semiconductor element 4, which are at a high potential while in operation, directly and safely. In other words, the temperature of any semiconductor element 4 can be measured regardless of the surface potential, thereby making it possible to inspect the heat-generating portions of the individual semiconductor elements 4 more accurately in the development stage of the semiconductor device 1, for example. Consequently, temperature measurement of the semiconductor element 4 while in operation, which is difficult to achieve with a thermocouple from the standpoint of safety, can be achieved safely and accurately with the optical fiber temperature measurement device 8.

Also, as illustrated in FIG. 5, the temperature measurement unit 81 is disposed a predetermined distance D away from the main electrode 40. Furthermore, the temperature measurement unit 81 is entirely covered by the bonding material S. In other words, bonding material S is interposed between the leading end of the temperature measurement unit 81 and the top face of the main electrode 40. Alternatively, the leading end of the temperature measurement unit 81 may contact the top face of the main electrode 40 directly. The bonding material S is an adhesive with high thermal conductivity containing a metal or carbon component as described above.

The distance D separating the temperature measurement unit 81 and the main electrode 40 treated as the temperature measurement site is preferably greater than 0 (the state in which the leading end of the temperature measurement unit 81 (mirror part 84) is in direct contact with the top face of the main electrode 40) and less than 2.0 times the vertical or horizontal length (the length in the Z direction in FIG. 5) of the cross section (the cross section cut in the direction orthogonal to the axial direction) of the cuboid temperature measurement unit 81. More preferably, the distance D separating the temperature measurement unit 81 and the main electrode 40 treated as the temperature measurement site is greater than 0.1 times and less than 1.0 times the vertical or horizontal lengths (the length in the Z direction in FIG. 5) of the cuboid temperature measurement unit 81.

By separating the temperature measurement unit 81 and the main electrode 40 treated as the temperature measurement site by the predetermined distance D, damage to the main electrode 40 can be minimized. With this arrangement, the temperature measurement unit 81 can be mechanically bonded to the main electrode 40 of the semiconductor element 4 and also receive the heat generated by the main electrode 40 directly. As a result, the temperature of the semiconductor element 4 can be detected from the temperature measurement unit 81 more precisely.

Additionally, the adhesion range of the temperature measurement unit 81 to the main electrode 40 is preferably not too large. In other words, the size of the bonding material S with respect to the size of the temperature measurement unit 81 is preferably contained within a predetermined range. More specifically, the adhesion area between the bonding material S and the main electrode 40 is preferably from 1 to 10 times the cross-sectional area of the temperature measurement unit 81 (particularly the heat-sensitive part 83). Setting this range makes it possible to improve the accuracy of the temperature measurement unit 81.

In addition, the cable unit 80 is preferably provided at a position apart from the main electrode 40, such that the cable unit 80 and the semiconductor element 4 do not contact each other directly. For example, in FIG. 5, the cable unit 80 is disposed along the top face (X direction or Y direction) of the main electrode 40. Furthermore, the encapsulating resin 7 is preferably interposed between the cable unit 80 and the semiconductor element 4. The above configuration makes it possible to prevent damage to the semiconductor element 4 and also prevent the effects of heat dissipation due to the encapsulating resin 7.

Additionally, the temperature measurement unit 81 is preferably disposed in the center of the main electrode 40 in a plan view. More preferably, at least a portion of the temperature measurement unit 81 preferably overlaps with the center of gravity portion of the main electrode 40 in a plan view. This arrangement makes it possible to measure the central temperature of the semiconductor element 4 with high precision.

As described above, according to the present embodiment, by using the temperature measurement device 8 including an optical fiber with insulating properties, it is possible to measure the temperature of any location on the semiconductor device 1 while in operation safely and precisely, regardless of the surface potential.

Figure 6:
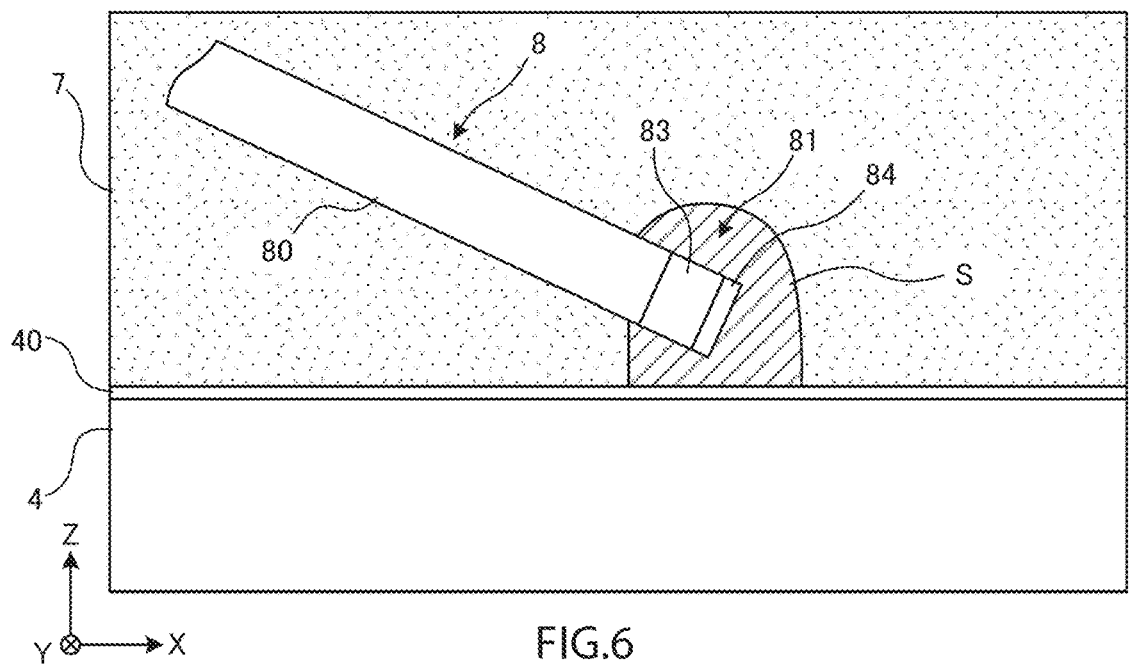
FIG. 6 is a schematic diagram illustrating another practical example of a temperature measurement device according to the present embodiment.
Figure 7:
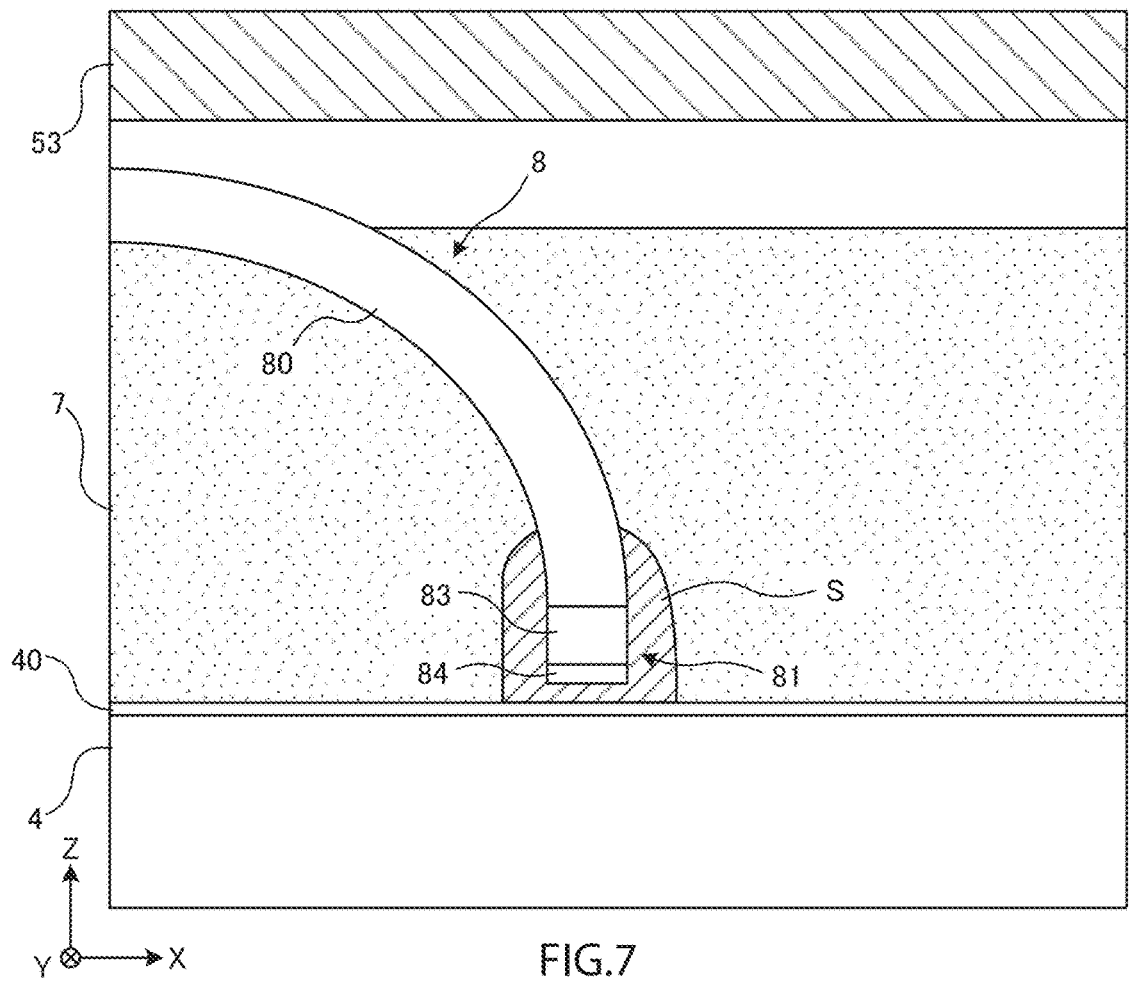
FIG. 7 is a schematic diagram illustrating another practical example of a temperature measurement device according to the present embodiment.
Figure 8:
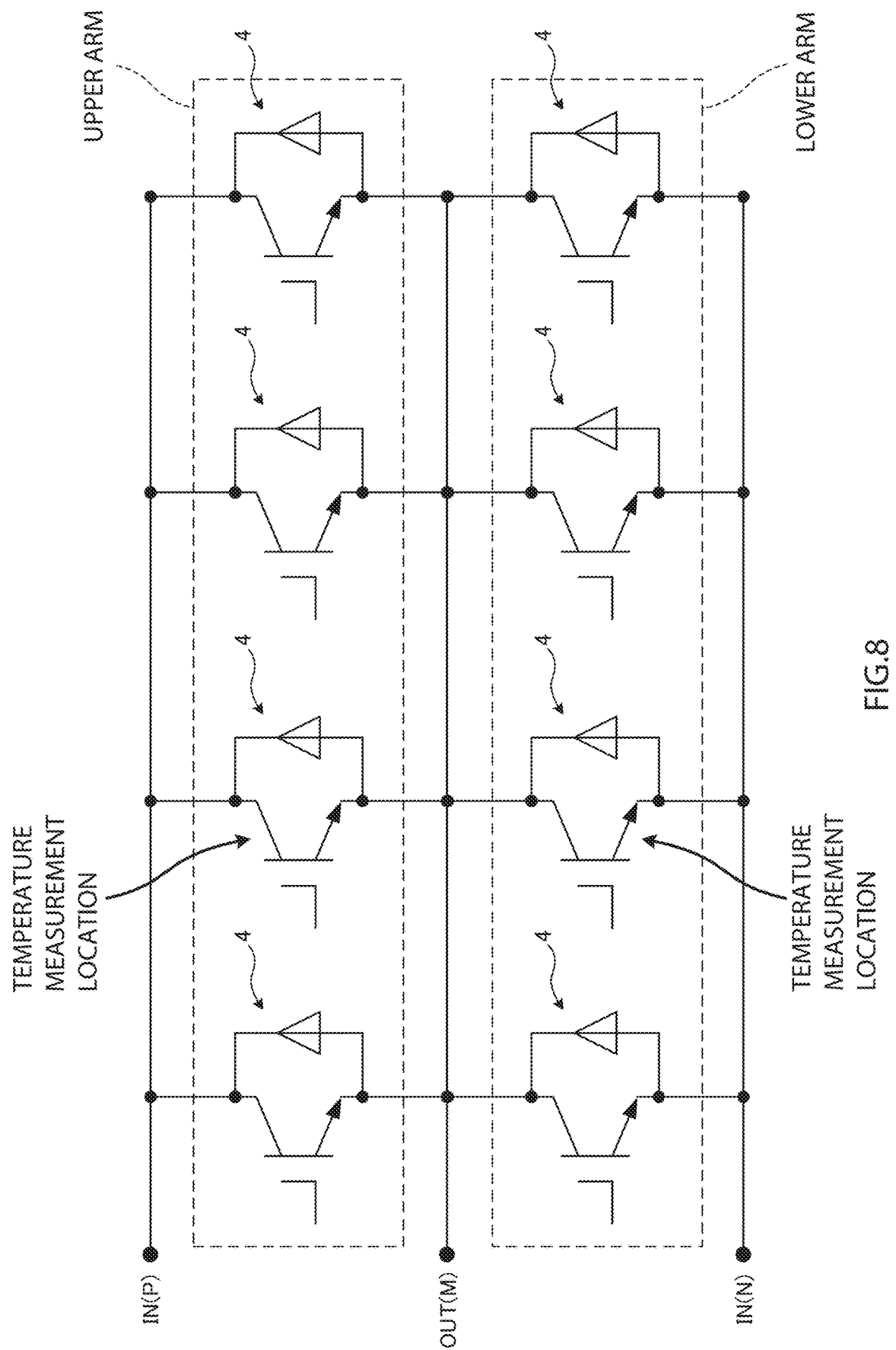
FIG. 8 is a circuit diagram illustrating an example of temperature measurement locations on a module.
Figure 9:
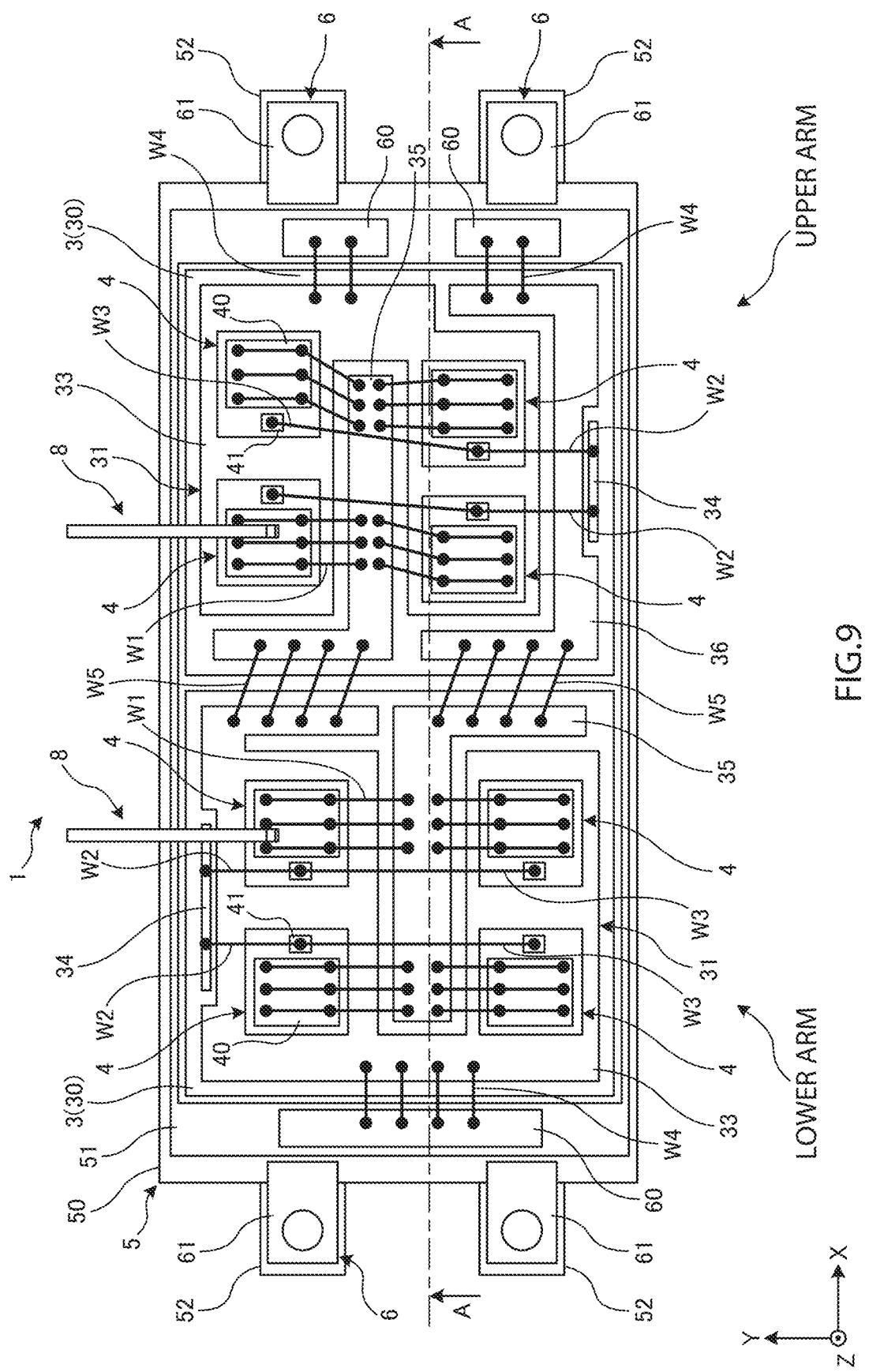
FIG. 9 is a schematic plan view illustrating an example of temperature measurement locations on a module.
Figure 10:
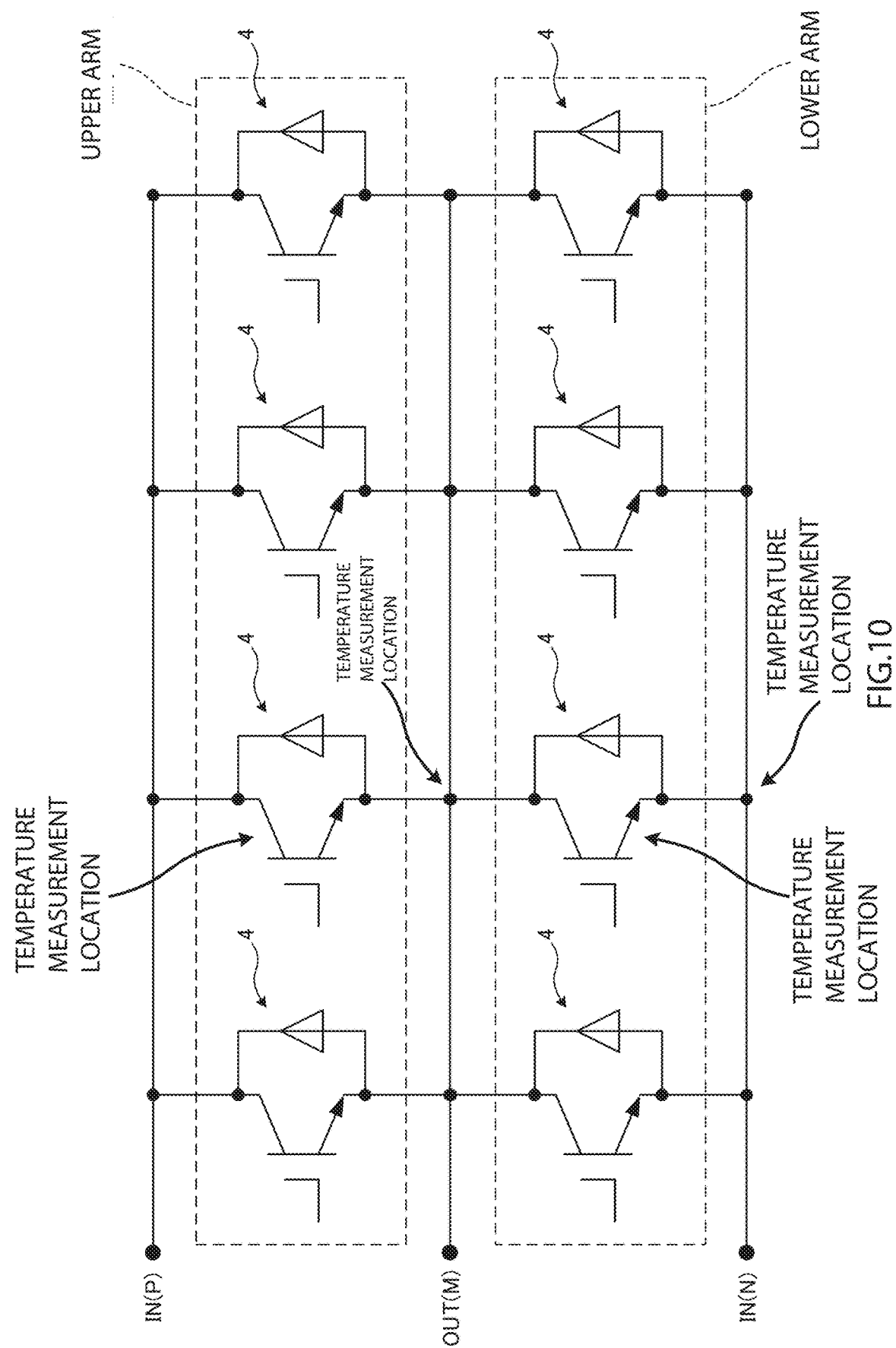
FIG. 10 is a circuit diagram illustrating another example of temperature measurement locations on a module.
Figure 11:
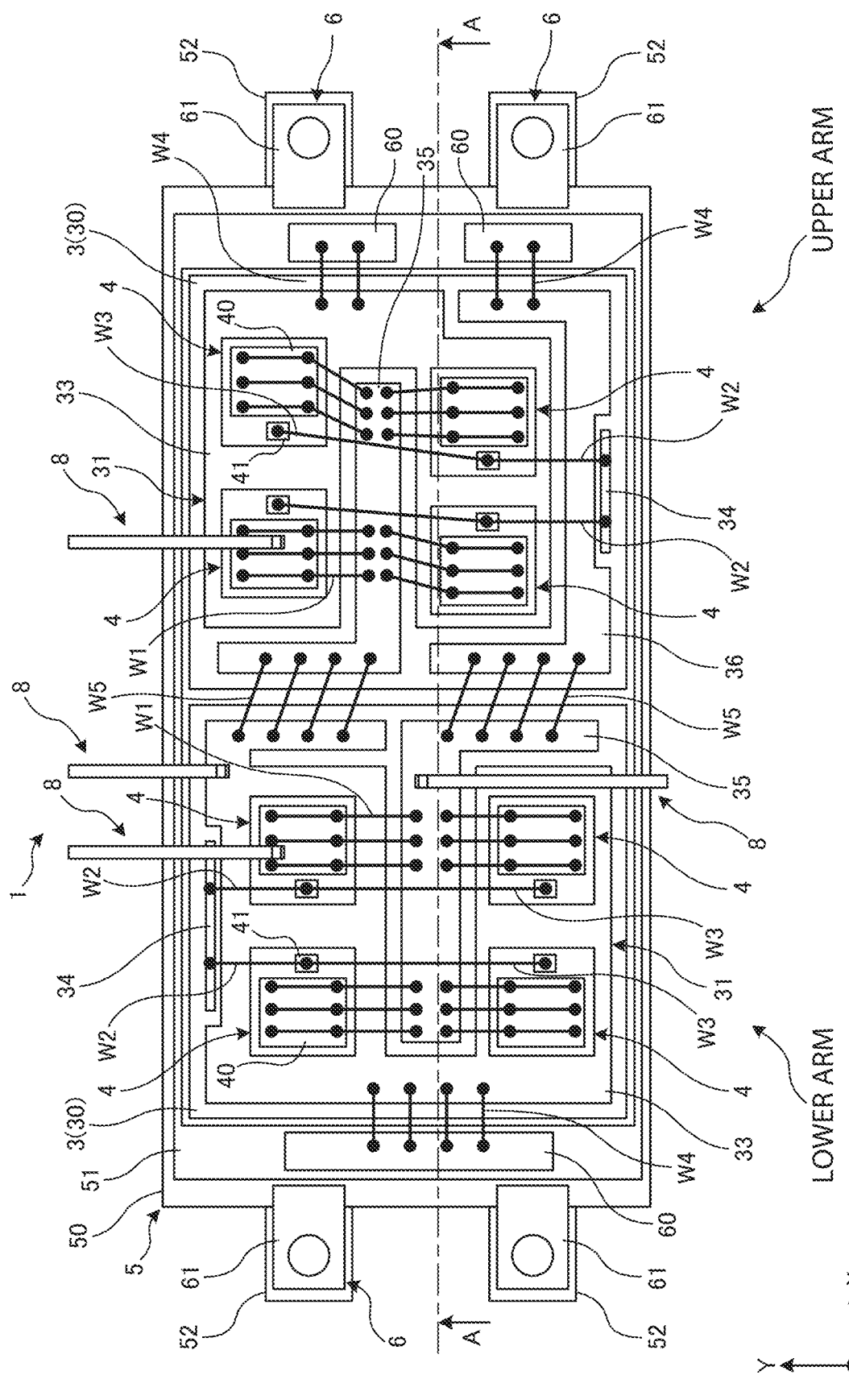
FIG. 11 is a schematic plan view illustrating another example of temperature measurement locations on a module.
Figure 12:
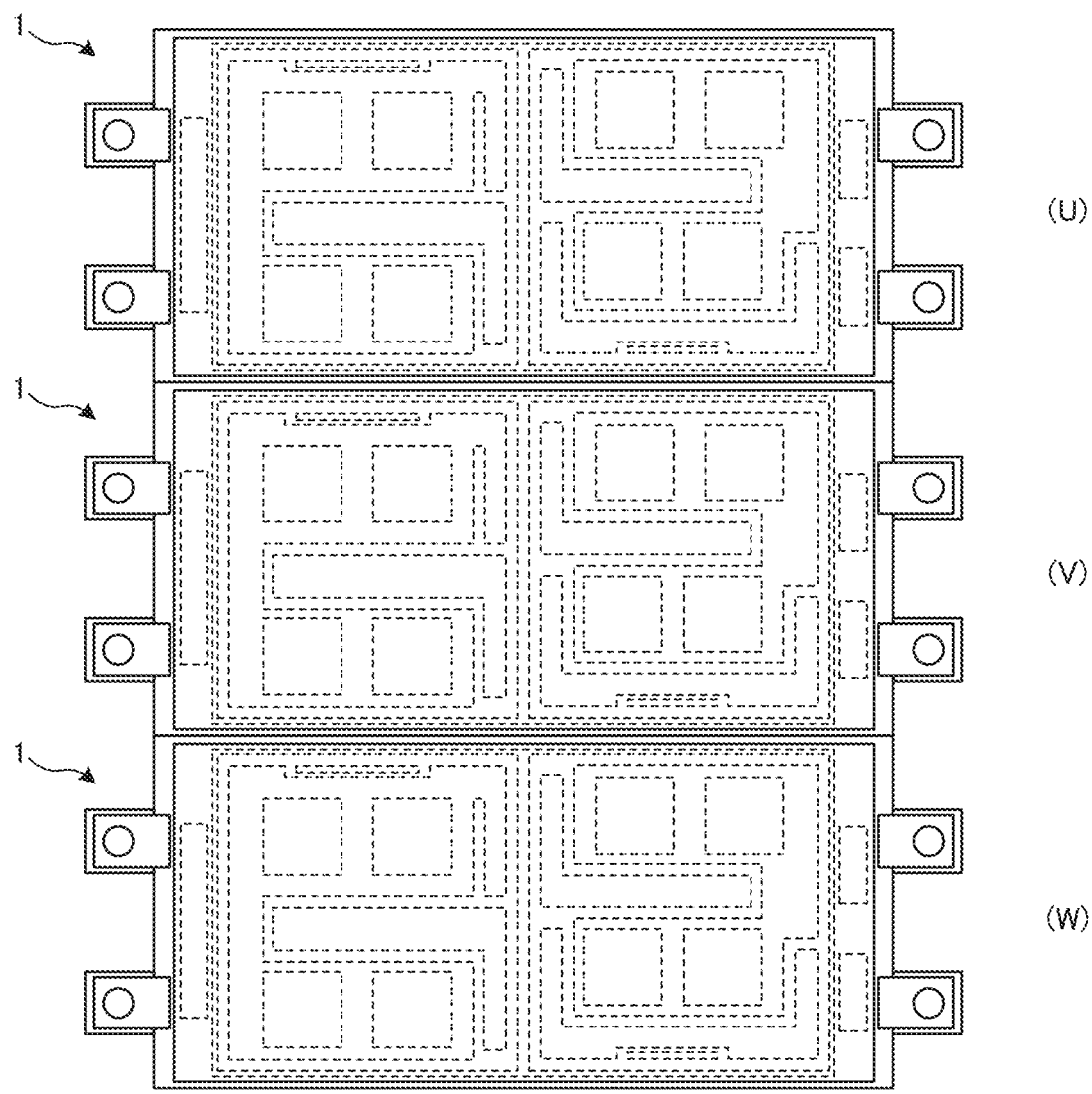
FIG. 12 is a schematic plan view illustrating an application example of the present invention.

Next, modifications will be described with reference to FIGS. 6 to 12. FIGS. 6 and 7 are schematic diagrams illustrating another practical example of a temperature measurement device according to the present embodiment. FIG. 8 is a circuit diagram illustrating an example of temperature measurement locations on a module. FIG. 9 is a schematic plan view illustrating an example of temperature measurement locations on a module. FIG. 10 is a circuit diagram illustrating another example of temperature measurement locations on a module. FIG. 11 is a schematic plan view illustrating another example of temperature measurement locations on a module. FIG. 12 is a schematic plan view illustrating an application example of the present invention.

In the embodiment described above, the cable unit 80 is configured to be disposed along the top face of the semiconductor element 4 (main electrode 40), but is not limited thereto. As illustrated in FIG. 6 for example, the cable unit 80 may also be disposed at a predetermined inclination angle with respect to the top face of the main electrode 40. In this case, the temperature measurement unit 81 on the lead end can be brought closer to the surface of the semiconductor element 4, thereby raising the measurement accuracy. Moreover, the cable unit 80 can be separated from the surface of the semiconductor element 4, thereby preventing damage to the semiconductor element 4.

Also, as illustrated in FIG. 7, the reflective surface of the mirror part 84 may face opposite the top face of the main electrode. In this case, the cable unit 80 is preferably curved slightly so as not to interfere with the lid member 53 positioned above the encapsulating resin 7. With this arrangement, the mirror part 84 can be brought closer to the top face of the main electrode 40.

Also, the above embodiment describes a case of measuring the temperature of a predetermined semiconductor element 4, but is not limited to this configuration. The configurations illustrated in FIGS. 8 to 11 are also possible. For example, as illustrated in FIGS. 8 and 9, a predetermined semiconductor element 4 included in the upper arm and another semiconductor element 4 included in the lower arm may be treated as temperature measurement locations. More specifically, the temperature measurement device 8 (temperature measurement unit 81) is bonded to the top face of the predetermined semiconductor element 4 included in the upper arm and the top face of the other semiconductor element 4 included in the lower arm (see FIG. 9). According to this configuration, it is possible to measure the temperature of a semiconductor element 4 in the upper arm and a semiconductor element 4 in the lower at different potentials at the same time. For example, a thermocouple requires wiring near a high-potential semiconductor element 4, but because the wiring tends to be thick, it is difficult to get the thermocouple close enough to the semiconductor element 4. Consequently, the temperature can only be measured for a semiconductor element 4 positioned on the periphery of the module. However, according to the present invention, because the optical fiber itself has insulating properties, it is possible to reduce the relative diameter of the wiring. For this reason, it is also possible to measure the temperature of semiconductor elements 4 positioned centrally in the module, which generate heat more easily.

Furthermore, as illustrated in FIGS. 10 and 11, it is possible to measure the temperature of not only the surface of the semiconductor elements 4 but also the temperature of a wiring layer (circuit board) along the way. More specifically, the temperature measurement device 8 (temperature measurement unit 81) may also be bonded to the top face of the circuit board 33 on which the semiconductor elements 4 are disposed, or on the top face of the other circuit board 35 different from the circuit board 33. This arrangement makes it possible to also measure the surface temperature of the predetermined circuit boards 33 and 35.

Also, as illustrated in FIG. 12, the present invention is also applicable to a semiconductor device 100 in which three (U phase, V phase, W phase) of the single semiconductor device 1 described above are arranged side by side in the Y direction to form a three-phase inverter circuit. By bonding the temperature measurement unit 81 to predetermined semiconductor elements 4 in the upper and lower arms of each phase, it is possible to measure temperature changes in any semiconductor elements 4 across the phases. As a result, it is possible to measure imbalances among the semiconductor elements 4 precisely. For example, in general, the temperature of the semiconductor elements 4 in the V phase disposed in the central portion of the module is thought to rise easily. Additionally, the temperature distribution may also change depending on the cooling conditions on the bottom face of the module. According to the present invention, the temperature of semiconductor elements 4 at any locations can be measured appropriately under various conditions.

Figure 13A:
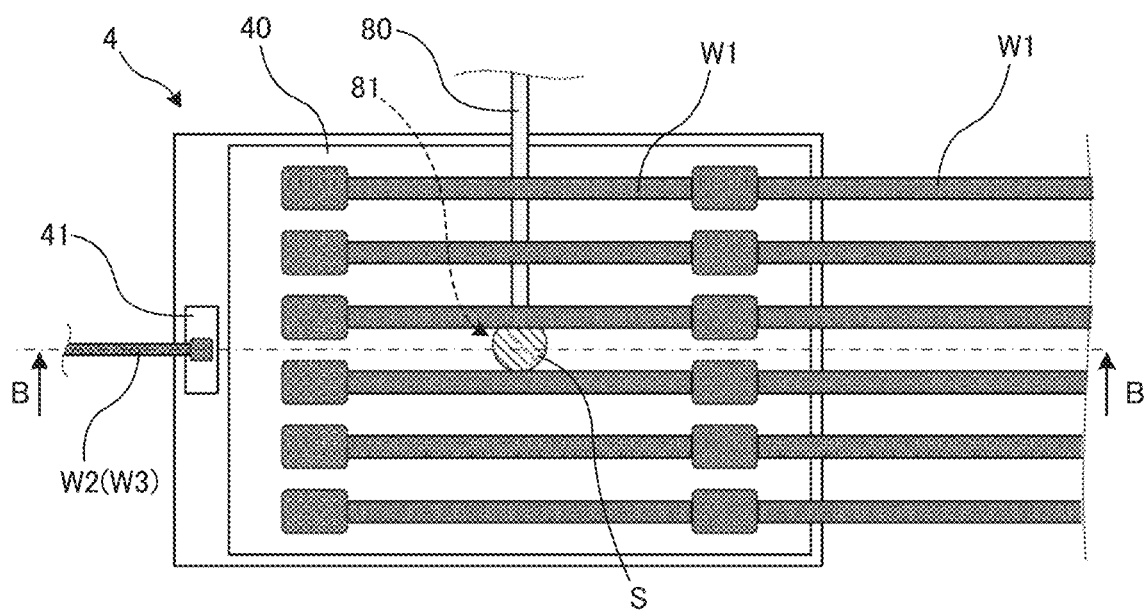
FIGS. 13A and 13B are examples of schematic diagrams illustrating the positional relationship between main current wiring and an optical fiber.
Figure 13A:
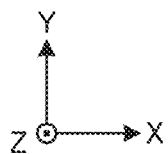
Figure 13B:
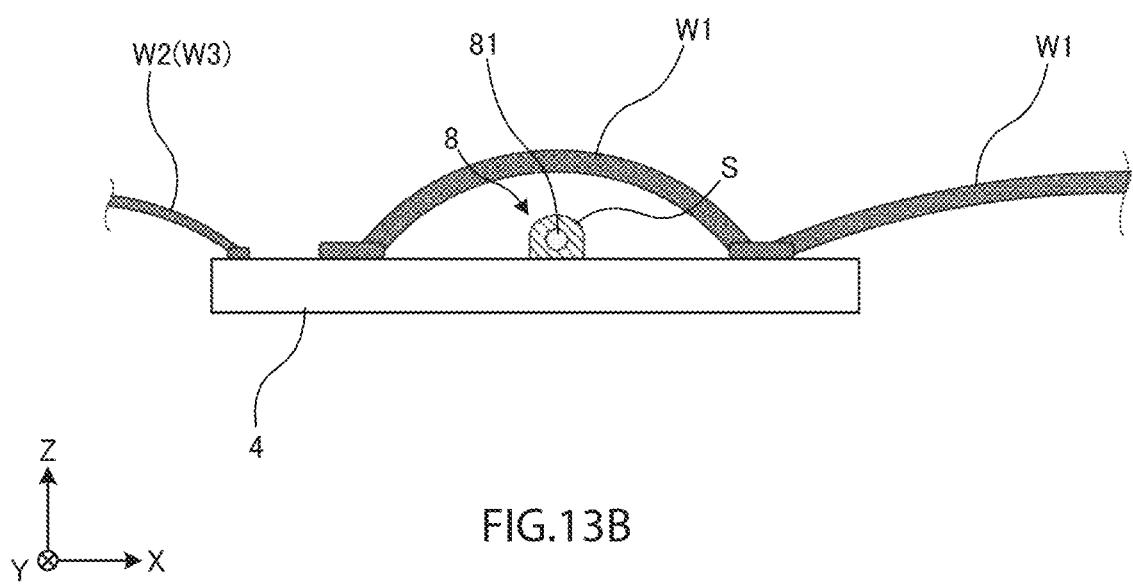
Figure 13B:
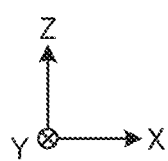
Figure 14A:
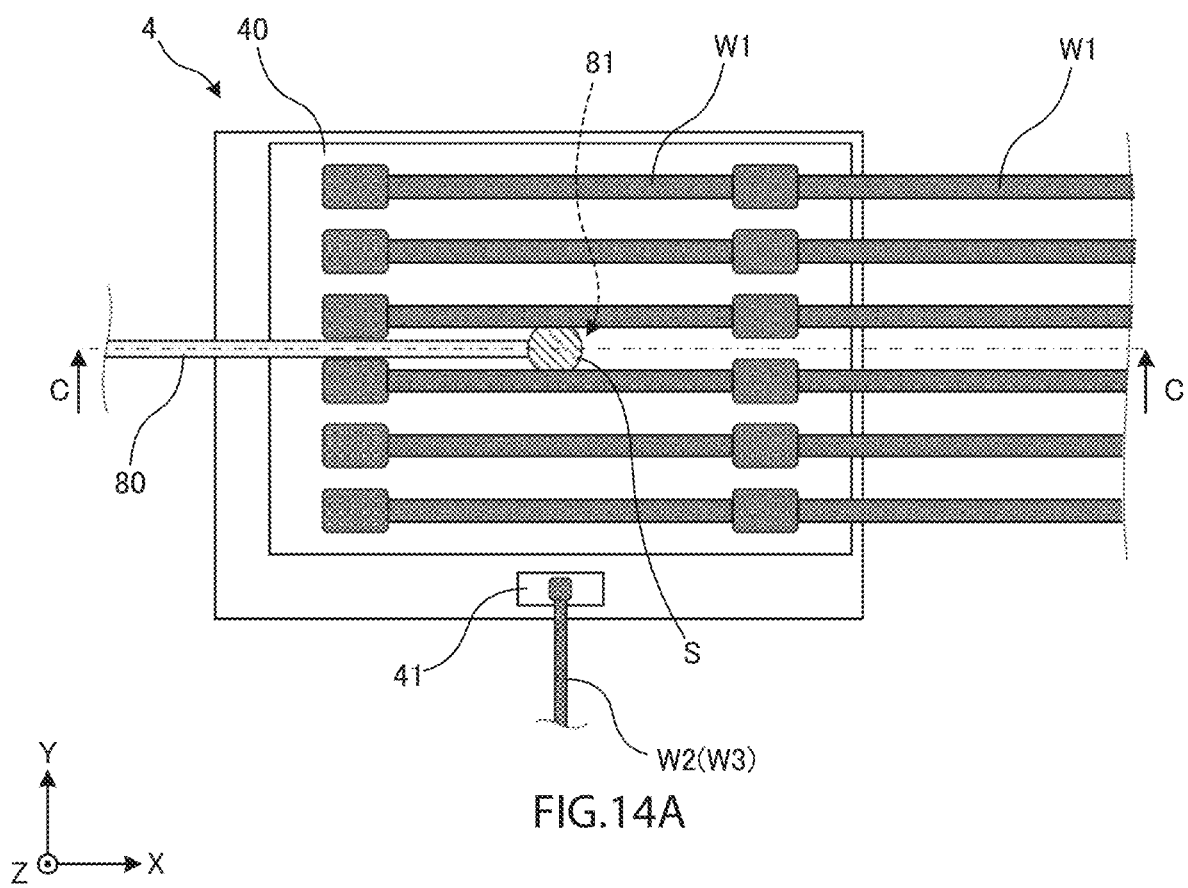
FIGS. 14A and 14B are another example of schematic diagrams illustrating the positional relationship between main current wiring and an optical fiber.
Figure 14B:
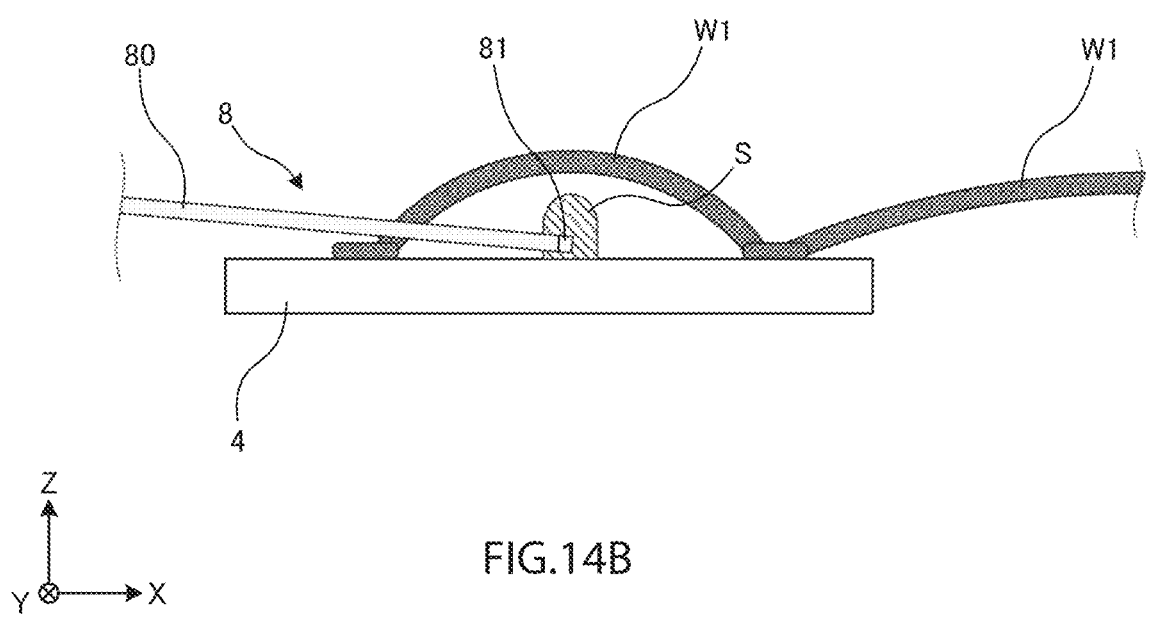

Next, FIGS. 13A to 14B will be referenced to describe variations in the positional relationship between the wiring members and the optical fiber. FIGS. 13A and 13B are an example of schematic diagrams illustrating the positional relationship between the main current wiring and the optical fiber. FIGS. 14A and 14B are another example of schematic diagrams illustrating the positional relationship between the main current wiring and the optical fiber. FIGS. 13A and 14A are enlarged partial views of the area around a semiconductor element in a plan view, FIG. 13B illustrates a cross section cut along the line B-B in FIG. 13A, and FIG. 14B illustrates a cross section cut along the line C-C in FIG. 14A.

For example, as illustrated in FIG. 13A, the main electrode 40 is disposed centrally on the top face of the semiconductor element 4. Also, the control electrode 41 is disposed by the edge of the main electrode 40 on the negative X side. In other words, the main electrode 40 and the control electrode 41 are arranged in the X direction.

Also, on the top face of the main electrode 40, the wiring member W1 acting as a main current wiring member is stitch-bonded in the X direction. Specifically, the wiring member W1 is bonded in two locations, one near the edge positioned on the negative X side of the main electrode 40 and the other near the opposite edge positioned on the positive X side. A plurality of wiring members W1 stitch-bonded in the X direction in this way are arranged in the Y direction.

As illustrated in FIG. 13B, each wiring member W1 forms an arch spanning from one edge to the other edge of the main electrode 40 in the X direction. In this case, the temperature measurement unit 81 is disposed in the center of the main electrode 40 in a plan view, and is bonded with the bonding material S. Also, the cable unit 80 is disposed along the Y direction above the semiconductor element 4 and passing under the arched wiring members W1. In other words, the cable unit 80 and the wiring members W1 are orthogonal to each other in a plan view. In this way, by passing the cable unit 80 under the arched wiring members W1, contact between the cable unit 80 and the wiring members W1 can be prevented.

Also, in the example of FIGS. 14A and 14B, as illustrated in FIG. 14A, the main electrode 40 is disposed centrally on the top face of the semiconductor element 4. Also, the control electrode 41 is disposed by the edge of the main electrode 40 on the negative Y side. In other words, the main electrode 40 and the control electrode 41 are arranged in the Y direction.

Also, on the top face of the main electrode 40, the wiring member W1 acting as a main current wiring member is stitch-bonded in the X direction. Specifically, the wiring member W1 is bonded in two locations, one near the edge positioned on the negative X side of the main electrode 40 and the other near the opposite edge positioned on the positive X side. A plurality of wiring members W1 stitch-bonded in the X direction in this way are arranged in the Y direction.

As illustrated in FIG. 14B, each wiring member W1 forms an arch spanning from one edge to the other edge of the main electrode 40 in the X direction. In this case, the temperature measurement unit 81 is disposed in the center of the main electrode 40 in a plan view, and is bonded with the bonding material S. The temperature measurement unit 81 is also disposed between two adjacent wiring members W1 in a plan view. Moreover, the cable unit 80 is disposed along the wiring members W1 (X direction) in a plan view. In other words, the cable unit 80 and the wiring members W1 are substantially parallel to each other in a plan view. In this way, by disposing the cable unit 80 so as to thread between the plurality of wiring members W1, contact between the cable unit 80 and the wiring members W1 can be prevented.

Also, in the above embodiment, the number and placement of the multilayer substrates 3 and the semiconductor elements 4 are not limited to the above configuration and may be changed appropriately. Similarly, the number of disposed wiring members and the number of connection points of the wiring members with respect to the circuit boards may also be modified appropriately.

Also, in the above embodiment, the number and layout of circuit boards is not limited to the above configuration and may be changed appropriately. The present embodiment describes an example of a semiconductor module for industrial use, but is not limited thereto and may be changed. For example, the present invention is also applicable to an in-vehicle (for electric equipment) semiconductor module.

Also, the above embodiment takes a configuration in which the multilayer substrates 3 and the semiconductor elements 4 are formed in a rectangular or square shape in a plan view, but the embodiment is not limited to this configuration. The multilayer substrates 3 and the semiconductor elements 4 may also be formed in a polygonal shape other than the above.

Also, in the above embodiment, the temperature measurement location is not limited to the above and may be changed appropriately. The temperature measurement location is not limited to a single location, and may be any number of locations.

Also, the above embodiment describes a case where the temperature measurement unit 81 is bonded to the top face of the main electrode 40 of the semiconductor element 4 through the bonding material S, but is not limited to this configuration. For example, the leading end (heat-sensitive part 83 or mirror part 84) of the temperature measurement unit 81 may also be bonded to the main electrode 40 or a predetermined circuit board 31 directly. It is sufficient if the temperature measurement unit 81 is bonded to a bonding target using the bonding material S, and it is not strictly necessary for the bonding material S to be interposed between the temperature measurement unit 81 and the bonding target.

In addition, the present embodiment and modifications have been described, but the above embodiment and the modifications may also be combined in full or in part and treated as another embodiment.

Also, the present embodiment is not limited to the above embodiment and modifications, and various modifications, substitutions, and alterations are possible without departing from the scope of the technical idea. Further, if the technical idea can be achieved according to another method through the advancement of the technology or another derivative technology, the technical idea may be implemented using the method. Consequently, the claims cover all embodiments which may be included in the scope of the technical idea.

Features of the above embodiment are summarized below.

The semiconductor device described in the above embodiment comprises a multilayer substrate in which a plurality of circuit boards are formed on a top face of an insulating plate, a semiconductor element disposed on a top face of a predetermined circuit board among the plurality of circuit boards, the semiconductor element having a top face on which a main electrode is formed, and a temperature measurement device that measures a temperature of the semiconductor element, wherein the temperature measurement device includes a cable unit composed of an optical fiber with insulating properties and a temperature measurement unit provided on a leading end of the cable unit, and the temperature measurement unit is bonded to the main electrode using a bonding material.

Also, in the semiconductor device described in the above embodiment, the temperature measurement unit is separated from the main electrode by a predetermined distance, and the bonding material covers the temperature measurement unit.

Also, in the semiconductor device described in the above embodiment, the bonding material is interposed between the temperature measurement unit and the main electrode.

Also, in the semiconductor device described in the above embodiment, the predetermined distance is greater than 0.1 times and less than 1.0 times a length of the temperature measurement unit in a cross section cut in a direction orthogonal to an axial direction.

Also, in the semiconductor device described in the above embodiment, the bonding material is an adhesive containing metal or carbon.

Also, in the semiconductor device described in the above embodiment, a contact area between the bonding material and the main electrode is from 1 to 10 times the area of the temperature measurement unit.

Also, in the semiconductor device described in the above embodiment, the temperature measurement device further includes a light source part, provided on a base end of the cable unit, that emits light into the cable unit, and a control unit that calculates the temperature of the semiconductor element on a basis of the light passing through the cable unit, the temperature measurement unit further includes a heat-sensitive part disposed on the leading end of the cable unit and a mirror part, disposed on the leading end of the heat-sensitive part, that reflects light from the light source part, and the control unit calculates the temperature of the semiconductor element on a basis of light emitted from the light source part, passed through the cable unit and the heat-sensitive part, and reflected by the mirror part.

Also, in the semiconductor device described in the above embodiment, the cable unit is provided at a position apart from the main electrode.

Also, in the semiconductor device described in the above embodiment, the cable unit is disposed along the top face of the main electrode.

Also, in the semiconductor device described in the above embodiment, the cable unit is disposed at a predetermined inclination angle with respect to the top face of the main electrode.

Also, in the semiconductor device described in the above embodiment, a reflective surface of the mirror part faces opposite the top face of the main electrode.

Also, in the semiconductor device described in the above embodiment, an upper arm and a lower arm are formed by the semiconductor element in plural, and the temperature measurement unit is bonded to each of a predetermined semiconductor element forming the upper arm and another semiconductor element forming the lower arm.

Also, in the semiconductor device described in the above embodiment, the temperature measurement unit is bonded to the top face of the circuit board on which the semiconductor element is disposed, or on the top face of another circuit board different from the circuit board.

Also, the temperature measurement method described in the above embodiment is a temperature measurement method for using a temperature measurement device to measure a temperature of a semiconductor element having a top face on which a main electrode is formed, the temperature measurement device including a cable unit composed of an optical fiber with insulating properties and a temperature measurement unit provided on a leading end of the cable unit, the temperature measurement method comprising measuring the temperature of the main electrode of the semiconductor element on a basis of a change in an output of the temperature measurement unit, wherein a leading end of the temperature measurement unit is bonded to the main electrode using a bonding material.

INDUSTRIAL APPLICABILITY

As described above, the present invention has an effect of enabling the temperature of each semiconductor element to be measured safely and accurately, and is particularly useful in a semiconductor device and a temperature measurement method applicable to semiconductor modules for industrial use.

REFERENCE SIGNS LIST

1: Semiconductor device
2: heatsink
3: multilayer substrate
4: semiconductor element
5: case member
6: terminal member
7: encapsulating resin
8: temperature measurement device
30: insulating plate
31: circuit board
32: metal plate
33: circuit board
34: circuit board
35: circuit board
36: circuit board
40: main electrode
41: control electrode
50: annular wall part
51: step part
52: projecting tab
53: lid member
60: inner terminal part
61: outer terminal part
80: cable unit
81: temperature measurement unit
82: control unit
83: heat-sensitive part
84: mirror part
85: light source part
86: light reception part
87: analysis part
88: splitting part
88a: first terminal
88b: second terminal
88c: third terminal
100: semiconductor device
W1, W2, W3, W4, W5: Wiring member

What is claimed is:

1. A semiconductor device, comprising:
a multilayer substrate including an insulating plate, and a plurality of circuit boards disposed on a top face of the insulating plate;
a semiconductor element disposed on a top face of one of the plurality of circuit boards, and having a main electrode disposed on a top face of the semiconductor element; and
a temperature measurement device for measuring a temperature of the semiconductor element, wherein
the temperature measurement device includes
a cable unit composed of an insulated optical fiber, and
a temperature measurement unit provided on one end of the cable unit, the temperature measurement unit being bonded to the main electrode of the semiconductor element using a bonding material.

2. The semiconductor device according to claim 1, wherein the bonding material covers the temperature measurement unit so that the temperature measurement unit is separated from the main electrode.

3. The semiconductor device according to claim 2, wherein the bonding material is interposed between the temperature measurement unit and the main electrode.

4. The semiconductor device according to claim 2, wherein the temperature measurement unit is separated from the main electrode by a distance greater than 0.1 times and less than 1.0 times a width of the temperature measurement unit, the width of the temperature measurement unit being measured as a length of a cross-sectional surface of the temperature measurement unit viewed in an axial direction of the cable unit.

5. The semiconductor device according to claim 1, wherein the bonding material is an adhesive containing metal or carbon.

6. The semiconductor device according to claim 1, wherein a contact area between the bonding material and the main electrode has a size in a range from 1 to 10 times a size of an area of a cross-sectional surface of the temperature measurement unit viewed in an axial direction of the cable unit.

7. The semiconductor device according to claim 1, wherein
the temperature measurement device further includes
a light source part provided on an other end of the cable unit, and emitting light into the cable unit toward the temperature measurement unit, and
an analysis part that calculates the temperature of the semiconductor element,
the temperature measurement unit further includes
a heat-sensitive part disposed on the one end of the cable unit, the light passing through the cable unit passing through the heat-sensitive part, and
a mirror part disposed on an end of the heat-sensitive part and reflecting the light from the light source part, thereby creating reflected light, and
the analysis part calculates the temperature of the semiconductor element using the reflected light from the mirror part.

8. The semiconductor device according to claim 1, wherein the cable unit is provided at a position apart from the main electrode.

9. The semiconductor device according to claim 1, wherein the cable unit is disposed along the top face of the main electrode.

10. The semiconductor device according to claim 1, wherein an axis of the cable unit is inclined with respect to the top face of the main electrode so as to form an acute angle between the axis of the cable unit and the top face of the main electrode.

11. The semiconductor device according to claim 7, wherein a reflective surface of the mirror part for reflecting the light faces the top face of the main electrode.

12. The semiconductor device according to claim 1, wherein
the semiconductor element is provided in plurality and the plurality of semiconductor elements form an upper arm and a lower arm, and
the temperature measurement unit is bonded to both one among the plurality of semiconductor elements forming the upper arm and another one among the plurality of semiconductor elements forming the lower arm.

13. The semiconductor device according to claim 1, wherein
a second temperature measurement unit is bonded to the top face of the circuit board on which the semiconductor element is disposed, or on the top face of another circuit board different from the circuit board.

14. The semiconductor device according to claim 1, wherein the temperature measurement unit is disposed at a center of the main electrode in a plan view of the semiconductor device.

15. The semiconductor device according to claim 1, further comprising
a main current wiring member bonded to the main electrode on which the temperature measurement unit is disposed.

16. The semiconductor device according to claim 14, wherein
the main current wiring member is composed of a conducting wire that has an arched shape, the main current wiring member being disposed above the semiconductor element, and
the cable unit is disposed so as to pass under the main current wiring member.

17. The semiconductor device according to claim 14, wherein
the main current wiring member is composed of a conducting wire, and
the cable unit is disposed in the same direction in which the main current wiring member extends.

18. A temperature measurement method for using a temperature measurement device for measuring a temperature of a semiconductor element having a main electrode on a top face of the semiconductor element,
the temperature measurement device including
a cable unit composed of an insulated optical fiber, and
a temperature measurement unit provided on one end of the cable unit,
the temperature measurement method comprising:
emitting light from the cable unit to the temperature measurement unit, and
measuring the temperature of the main electrode of the semiconductor element using a change in an output of the light from the temperature measurement unit, wherein
the one end of the temperature measurement unit is bonded to the main electrode of the semiconductor element using a bonding material.

* * * * *